United States Patent
Funatsuki et al.

(10) Patent No.: US 11,282,578 B2
(45) Date of Patent: Mar. 22, 2022

(54) SEMICONDUCTOR STORAGE APPARATUS INCLUDING A MEMORY CELL ARRAY

(71) Applicant: Kioxia Corporation, Minato-ku (JP)

(72) Inventors: Rieko Funatsuki, Yokohama (JP); Takahiko Hara, Yokohama (JP); Takashi Maeda, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/906,140

(22) Filed: Jun. 19, 2020

(65) Prior Publication Data

US 2021/0090665 A1 Mar. 25, 2021

(30) Foreign Application Priority Data

Sep. 19, 2019 (JP) .............................. JP2019-170823

(51) Int. Cl.
*G11C 16/26* (2006.01)
*G11C 16/04* (2006.01)
*H01L 27/115* (2017.01)

(52) U.S. Cl.
CPC .......... *G11C 16/26* (2013.01); *G11C 16/0483* (2013.01); *H01L 27/115* (2013.01)

(58) Field of Classification Search
CPC ....... G11C 16/26; G11C 16/0483; G11C 7/14; G11C 16/08; H01L 27/11582
See application file for complete search history.

(56) References Cited

U.S. PATENT DOCUMENTS

| | | | |
|---|---|---|---|
| 9,520,409 B2* | 12/2016 | Kim | .................. H01L 27/11582 |
| 10,269,828 B2 | 4/2019 | Futatsuyama et al. | |
| 10,340,013 B2 | 7/2019 | Futatsuyama et al. | |
| 10,559,364 B2 | 2/2020 | Futatsuyama et al. | |
| 2019/0057975 A1* | 2/2019 | Kim | ..................... H01L 29/1029 |
| 2019/0214406 A1 | 7/2019 | Futatsuyama et al. | |
| 2019/0318784 A1* | 10/2019 | Lee | ..................... G11C 11/5628 |

FOREIGN PATENT DOCUMENTS

| | | |
|---|---|---|
| JP | 2018-164070 A | 10/2018 |
| JP | 6495852 B2 | 4/2019 |

* cited by examiner

*Primary Examiner* — Sung Il Cho
(74) *Attorney, Agent, or Firm* — Oblon, McClelland, Maier & Neustadt, L.L.P.

(57) ABSTRACT

A semiconductor storage apparatus includes a memory cell array including a plurality of memory string structures each including a pair of memory string formation sections each formed by a channel formation film and a charge storage film and including a select gate transistor and a plurality of memory cell transistors connected in series and a partial conductive layer configured to electrically connect the memory string formation sections. During a reading operation of a memory cell transistor, at least one of the plurality of memory cell transistors and the select gate transistor belonging to the memory string formation section is turned off such that a channel of a memory cell transistor is fixed to a potential of a source line or a potential of bit lines.

4 Claims, 21 Drawing Sheets

US 11,282,578 B2

SEMICONDUCTOR STORAGE APPARATUS INCLUDING A MEMORY CELL ARRAY

CROSS REFERENCE TO RELATED APPLICATION

This application is based upon and claims the benefit of priority from the prior Japanese Patent Application No. 2019-170823 filed on Sep. 19, 2019; the entire contents of which are incorporated herein by reference.

FIELD

Embodiments described herein relate generally to a semiconductor storage apparatus.

BACKGROUND

A NAND flash memory has been known as a semiconductor storage apparatus.

DETAILED DESCRIPTION

A semiconductor storage apparatus according to the present embodiment includes a semiconductor substrate including a substrate surface extending in a first direction and a second direction intersecting the first direction, a source line arranged on the substrate surface, a plurality of word lines arranged on the source line and stacked in a third direction perpendicular to the first direction and the second direction, and a plurality of bit lines arranged on the plurality of word lines and extending in the first direction. The semiconductor storage apparatus also includes a memory cell array including a plurality of memory string structures extending in the third direction and respectively connected between the corresponding bit lines and the source line.

Each of the memory string structures includes a first memory string formation section arranged on one side in the first direction, formed by a channel formation film and a charge storage film, and including a select gate transistor and a plurality of memory cell transistors connected in series, a second memory string formation section arranged on the other side in the first direction, formed by a channel formation film and a charge storage film, and including a select gate transistor and a plurality of memory cell transistors connected in series, and a conductive section configured to electrically connect at least one portion of the first memory string formation section with at least one portion of the second memory string formation section.

During a reading operation to a first memory cell transistor included in the first memory string formation section, at least one of the plurality of memory cell transistors and the select gate transistor belonging to the second memory string formation section is turned off such that a channel of at least a second memory cell transistor included in the second memory string formation section and at a same position as a position of the first memory cell transistor in the third direction is fixed to a potential of the source line or a potential of the bit line.

An embodiment will be described below with reference to the drawings.

First Embodiment

Figure 1:
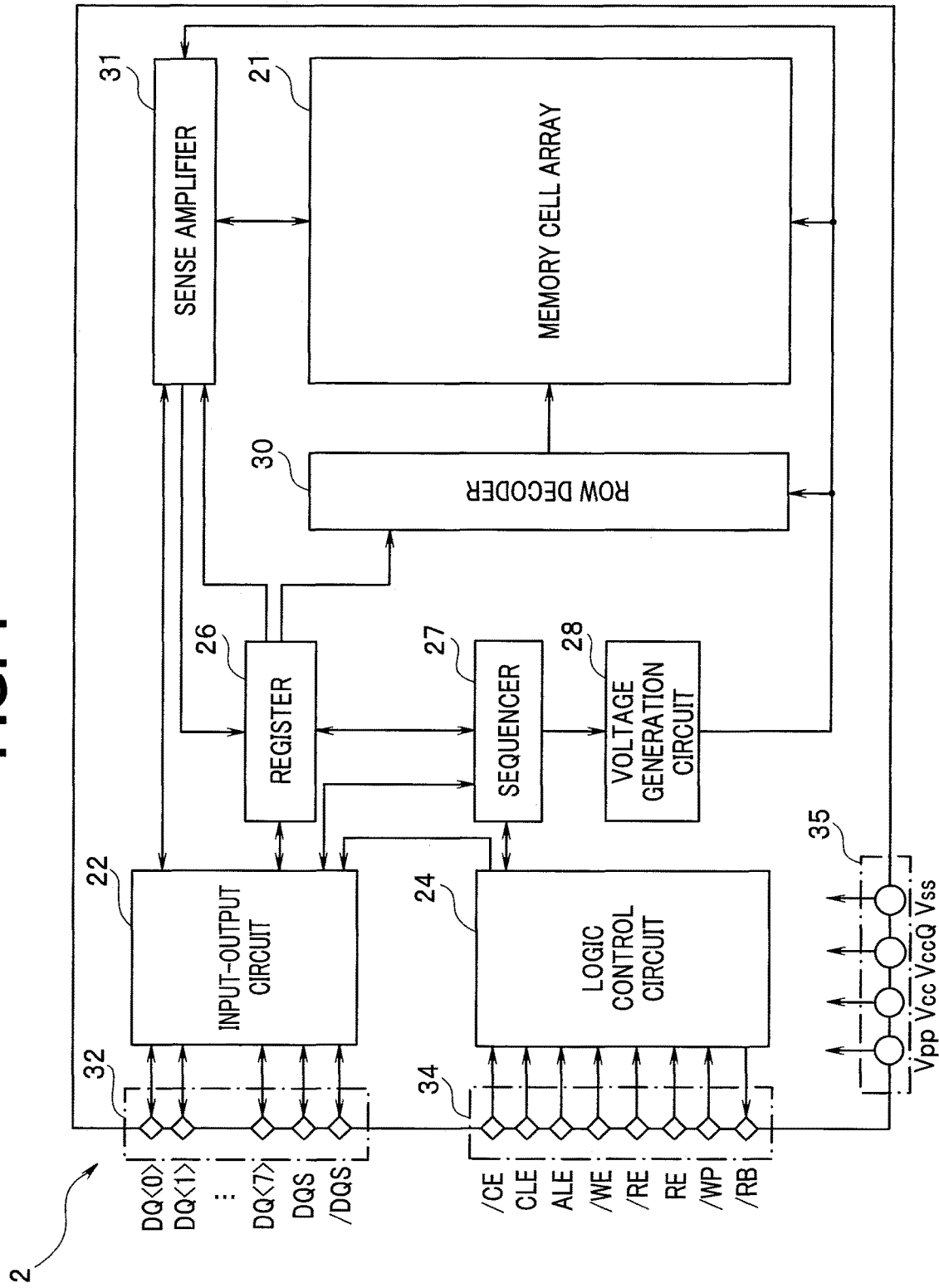
FIG. 1 is a block diagram illustrating a configuration example of a nonvolatile memory according to an embodiment of the present invention.

FIG. 1 is a block diagram illustrating a configuration example of a nonvolatile memory according to the present embodiment. The nonvolatile memory 2 includes a memory cell array 21, an input-output circuit 22, a logic control circuit 24, a register 26, a sequencer 27, a voltage generation circuit 28, a row decoder 30, a sense amplifier unit 31, an input-output pad group 32, a logic control pad group 34, and a power source inputting terminal group 35.

The memory cell array 21 includes a plurality of nonvolatile memory cell transistors (not illustrated) associated with word lines and bit lines.

The input-output circuit 22 transmits and receives a signal DQ<7:0> and data strobe signals DQS and /DQS to and from an external memory controller (not illustrated). The input-output circuit 22 transfers a command and an address within the signal DQ<7:0> to the register 26. The input-output circuit 22 transmits and receives write data and read data to and from the sense amplifier unit 31.

The logic control circuit 24 receives a chip enable signal /CE, a command latch enable signal CLE, an address latch enable signal ALE, a write enable signal /WE, read enable signals RE and an /RE, and a write protect signal /WP from an external memory controller (not illustrated). The logic control circuit 24 transfers a ready busy signal /RB to the memory controller, and notifies a state of the nonvolatile memory 2 to outside.

The voltage generation circuit 28 generates a voltage required for operations such as writing, reading, and erasing of data based on an instruction from the sequencer 27.

The row decoder 30 receives a block address and a row address within an address from the register 26, to select a corresponding block based on the block address and select a corresponding word line based on the row address.

The sense amplifier unit 31 senses read data read out to a bit line from the memory cell transistor and transfers the sensed read data to the input-output circuit 22 at the time of data reading. The sense amplifier unit 31 transfers write data to be written via a bit line to the memory cell transistor at the time of data writing. The sense amplifier unit 31 includes a plurality of sense amplifiers SA.

The input-output pad group 32 includes a plurality of terminals (pads) respectively corresponding to the signal DQ<7:0> and the data strobe signals DQS and /DQS to transmit and receive each of signals including data to and from the external memory controller (not illustrated).

The logic control pad group 34 includes a plurality of terminals (pads) respectively corresponding to the chip enable signal /CE, the command latch enable signal CLE, the address latch enable signal ALE, the write enable signal /WE, the read enable signals RE and /RE, and the write protect signal /WP to transmit and receive each of signals to and from the external memory controller (not illustrated).

A power source inputting terminal group 35 includes a plurality of terminals respectively configured to receive power supply voltages Vcc, VccQ, and Vpp and a ground voltage Vss to supply various types of operation power to the nonvolatile memory 2 from outside. The power supply voltage Vcc is a circuit power supply voltage to be generally supplied from outside as operation power, and a voltage of approximately 3.3 volts, for example, is inputted as the power supply voltage Vcc. A voltage of 1.2 volts, for example, is inputted as the power supply voltage VccQ. The power supply voltage VccQ is used as power for driving an input-output system configured to transmit and receive a signal between the external memory controller (not illustrated) and the nonvolatile memory 2.

The power supply voltage Vpp is a higher power supply voltage than the power supply voltage Vcc, and a voltage of 12 volts, for example, is inputted as the power supply voltage Vpp. When the nonvolatile memory 2 is used in an environment in which a high voltage cannot be supplied, for example, a voltage need not be supplied to the power supply voltage Vpp. Even when the power supply voltage Vpp is not supplied, the nonvolatile memory 2 can perform various types of operations if the power supply voltage Vcc has been supplied to the nonvolatile memory 2. In other words, the power supply voltage Vcc is power to be standardly supplied to the nonvolatile memory 2, and the power supply voltage Vpp is power to be additionally/optionally supplied depending on a usage environment, for example.

Figure 2:
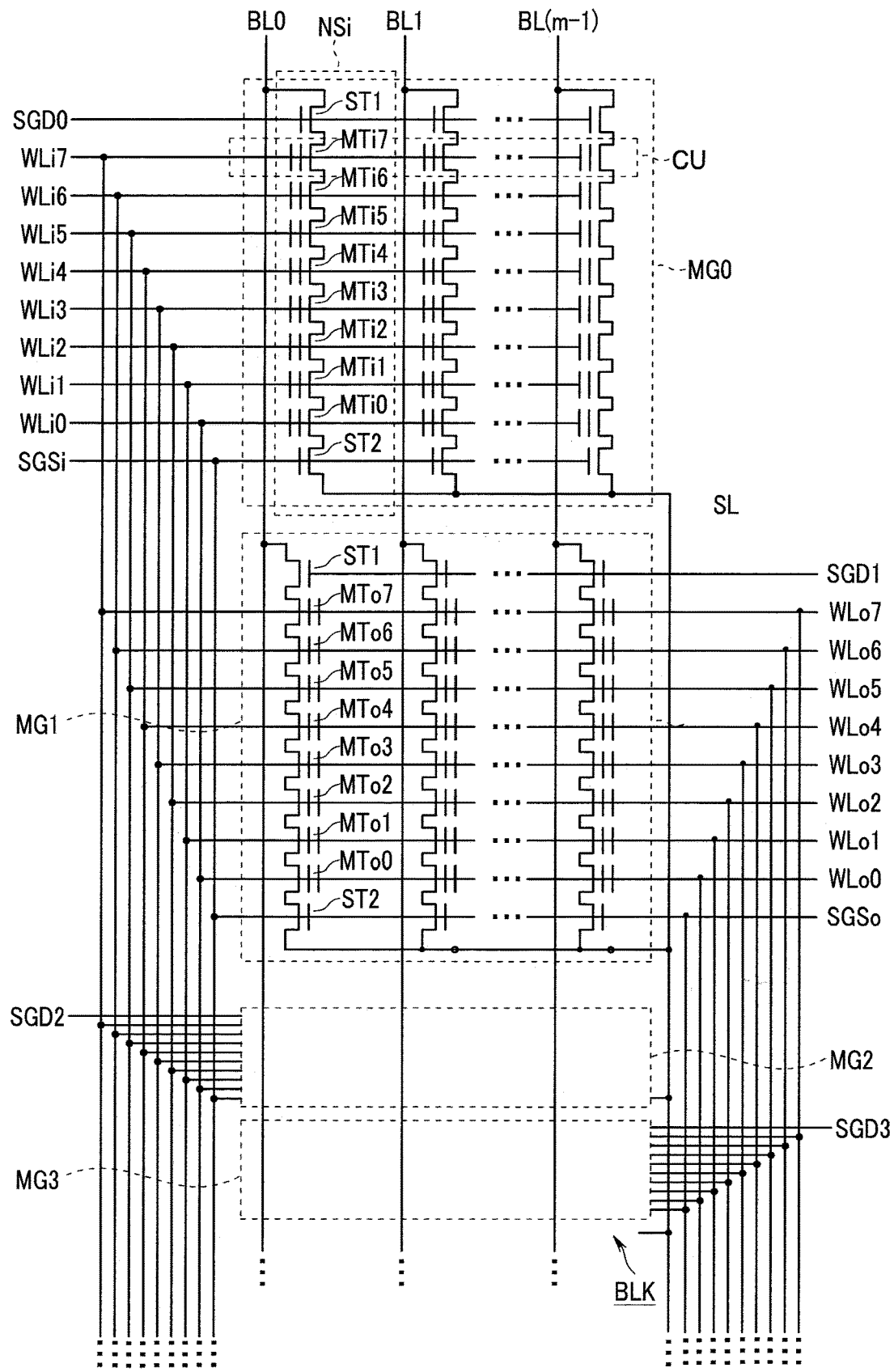
FIG. 2 is a diagram illustrating a configuration example of a block of a memory cell array having a three-dimensional structure.

FIG. 2 is a diagram illustrating a configuration example of a block of a memory cell array having a three-dimensional structure. FIG. 3 illustrates an equivalent circuit of one block BLK among a plurality of blocks constituting the memory cell array having a three-dimensional structure. The other block of the memory cell array has a similar configuration to the configuration illustrated in FIG. 2.

As illustrated, a block BLK includes a plurality of memory groups MG (MG0, MG1, MG2, . . . ). Each of the memory groups MG includes a plurality of NAND string NS. In the following, the NAND string in each of the even-numbered memory groups MGi (MG0, MG2, MG4, . . . ) is also represented by a NAND string NSi, and the NAND string in each of the odd-numbered memory groups MGo (MG1, MG3, MG5, . . . ) is also represented by a NAND string NSo.

Each of the NAND strings NS includes eight memory cell transistors MT (MT0 to MT7) and select gate transistors ST1 and ST2, for example. The memory cell transistor MT includes a gate and a charge storage layer, and holds data in a nonvolatile manner. The memory cell transistor MT is connected in series between a source of the select gate transistor ST1 and a drain of the select gate transistor ST2. In the following, the memory cell transistor MT included in the NAND string NSi is also represented by a memory cell transistor MTi, and the memory cell transistor MT included in the NAND string NSo is also represented by a memory cell transistor MTo.

Note that the number of memory cell transistors MT included in the NAND string NS is not limited to eight, but may be 32, 48, 64, or 96. Although the select gate transistors ST1 and ST2 are represented as one transistor on an electrical circuit, the select gate transistors may be the same as the memory cell transistors in structure. To enhance a cutoff characteristic, for example, a plurality of select gate transistors may be used as each of the select gate transistors ST1 and ST2. Further, in a portion where periodicity of the memory cell transistor MT is disrupted, for example, a portion between the memory cell transistor MT and the select gate transistor ST1/ST2, a dummy cell transistor DT may be provided.

The select gate transistors ST1 included in the memory groups MG0 to MG7 have their respective gates commonly connected to the select gate lines SGD0 to SGD7. A voltage is independently applied to each of the select gate lines SGD via the row decoder 30. The select gate transistors ST2 included in the even-numbered memory groups MGi have their respective gates commonly connected to the select gate line SGSi, for example, and the select gate transistors ST2 included in the even-numbered memory groups MGo have their respective gates commonly connected to the select gate line SGSo, for example. A voltage is independently applied, for example, to the select gate lines SGSi and SGSo.

In the same block BLK, the respective gates of the memory cell transistors MTi0 to MTi7 included in the memory groups MGi are respectively commonly connected to the word lines WLi0 to WLi7. On the other hand, the respective gates of the memory cell transistors MTo0 to MTo7 included in the memory groups MGo are respectively commonly connected to the word lines WLo0 to WLo7. A voltage is independently applied to the word lines WLi and WLo via the row decoder 30.

Further, within the NAND memory cell array 21, the select gate transistors ST1 in the NAND strings NS in the same column have their respective drains connected to a common bit line BL. In other words, the bit line BL commonly connects the NAND strings NS among the plurality of memory groups MG. Further, the plurality of select gate transistors ST2 have their respective sources connected to a common source line SL.

A set of the plurality of memory cell transistors MT connected to the common word line WL within the one memory group MG is referred to as a cell unit CU, for example. For example, a storage capacity of the cell unit CU including the memory cell transistors MT each storing one-bit data is defined as "one-page data". The cell unit CU can have a storage capacity of two pages or more depending on the number of bits composing data stored in the memory cell transistor MT.

As described above, the memory group MG includes a plurality of NAND strings NS respectively connected to the different bit lines BL and connected to the same select gate line SGD. The block BLK includes the plurality of memory groups MG that share the word lines WL. The NAND memory cell array 21 includes the plurality of blocks BLK that share the bit lines BL.

Figure 3A:
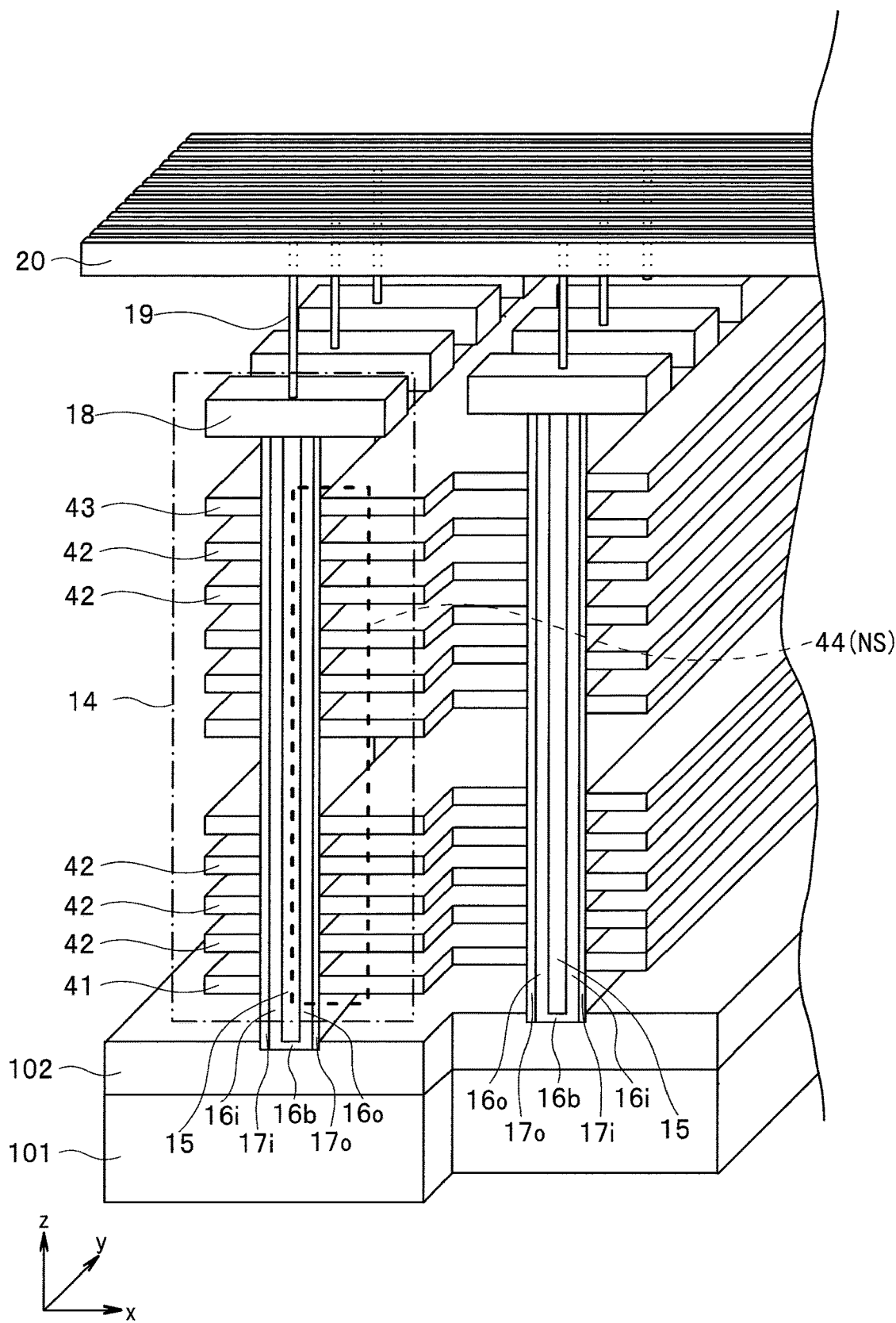
FIG. 3A is a perspective view illustrating a cross-sectional structure of a partial region of a memory cell array in a NAND memory having a three-dimensional structure.

FIG. 3A is a perspective view illustrating a cross-sectional structure of a partial region of a memory cell array in a NAND memory having a three-dimensional structure.

As illustrated in FIG. 3A, a conductive layer 102 is formed on an insulating layer 101. The conductive layer 102 functions as a source line, for example. On the conductive layer 102, a plurality of memory string formation sections 44 as structures each forming the NAND string NS are provided. Each of the memory string formation sections 44 is connected to the conductive layer 102 at its lower end. Each of the memory string formation sections 44 is connected to one of conductive films 20 via a connection section 18 and a contact plug 19 at its upper end. Note that the conductive film 20 functions as a bit line BL. The conductive layer 102 extends along an xy plane. The conductive films 20 extend along an x-axis, and are arranged along a y-axis.

In other words, on the conductive layer 102, a wiring layer 41 functioning as a select gate line SGS, a plurality of wiring layers 42 each functioning as a word line WL, and a wiring layer 43 functioning as a select gate line SGD. Note that in a structure including a plurality of select gate transistors ST1 and ST2, each of the wiring layers 41 and 43 is constituted by not one layer but a plurality of layers. In a structure including a dummy cell transistor DT, the corresponding wiring layer 42 functions as a dummy word line WDL.

A trench for memory 13, which reaches the conductive layer 102 via the wiring layers 41, 42, and 43, is formed. The trench for memory 13 is formed in a belt shape having a predetermined width in an x-axis direction and using a y-axis direction as a longitudinal direction when viewed from above in a z-direction. A charge storage film 17 and a channel formation film 16 are sequentially formed on a side surface of the trench for memory 13. Further, an insulating film 15 is embedded in the trench for memory 13.

Figure 3B:
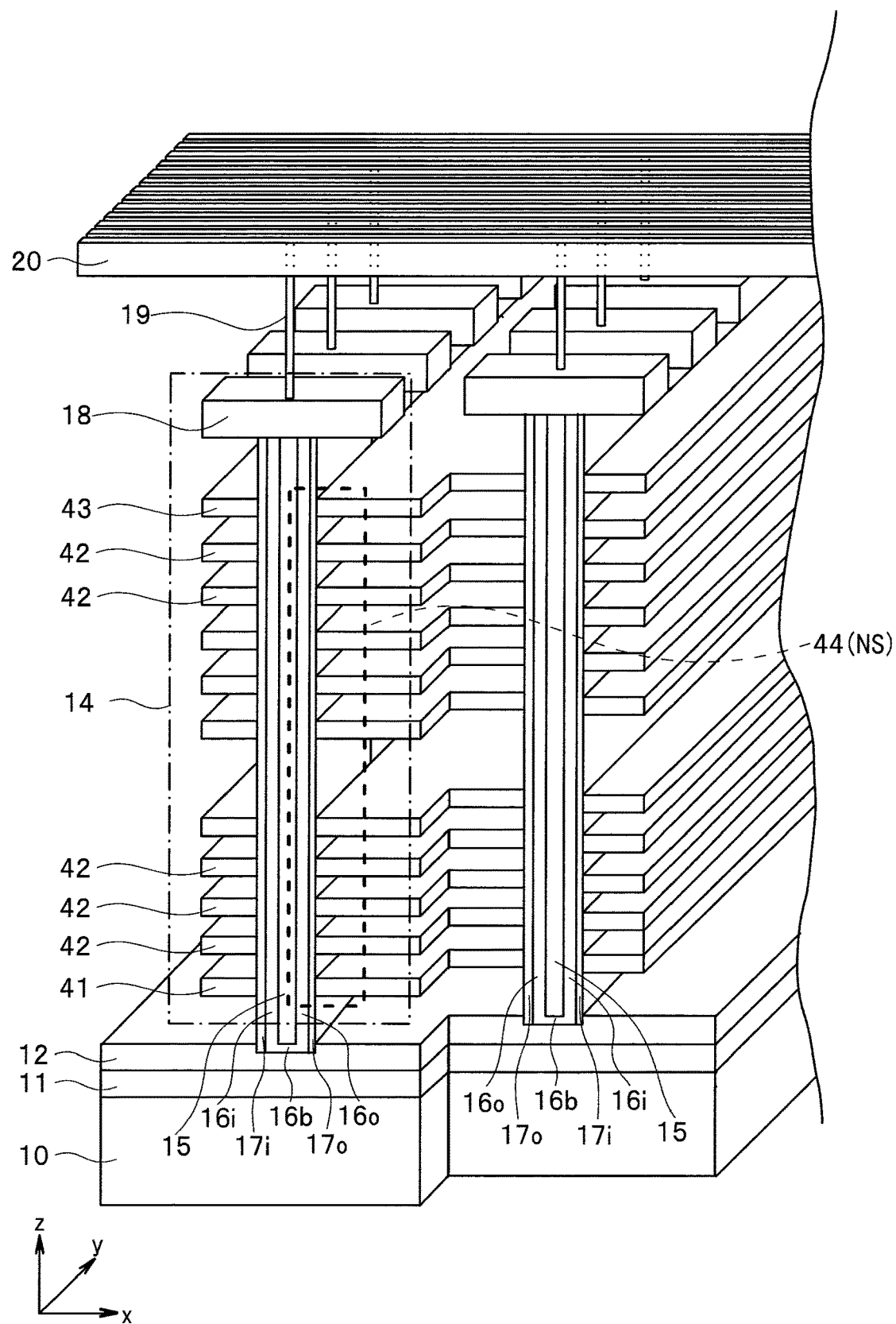
FIG. 3B is a perspective view illustrating another cross-sectional structure of the partial region of the memory cell array in the NAND memory having a three-dimensional structure.

Note that a configuration in a semiconductor substrate 10 as a lower end of the memory string formation section 44 may be a configuration as illustrated in FIG. 3B. FIG. 3B is a perspective view illustrating another cross-sectional structure of the partial region of the memory cell array in the NAND memory having a three-dimensional structure. In other words, as illustrated in FIG. 3B, the memory string formation section 44 may be provided on the semiconductor substrate 10. The semiconductor substrate 10 is formed of non-doped polycrystalline silicon (polysilicon), for example. An n-type well 11 is provided on a surface region of the semiconductor substrate 10. A p-type well 12 is formed within the n-type well 11. The n-type well 11 and the p-type well 12 extend along the xy plane. Each of the memory string formation sections 44 is connected to the p-type well 12 at its lower end.

Figure 4:
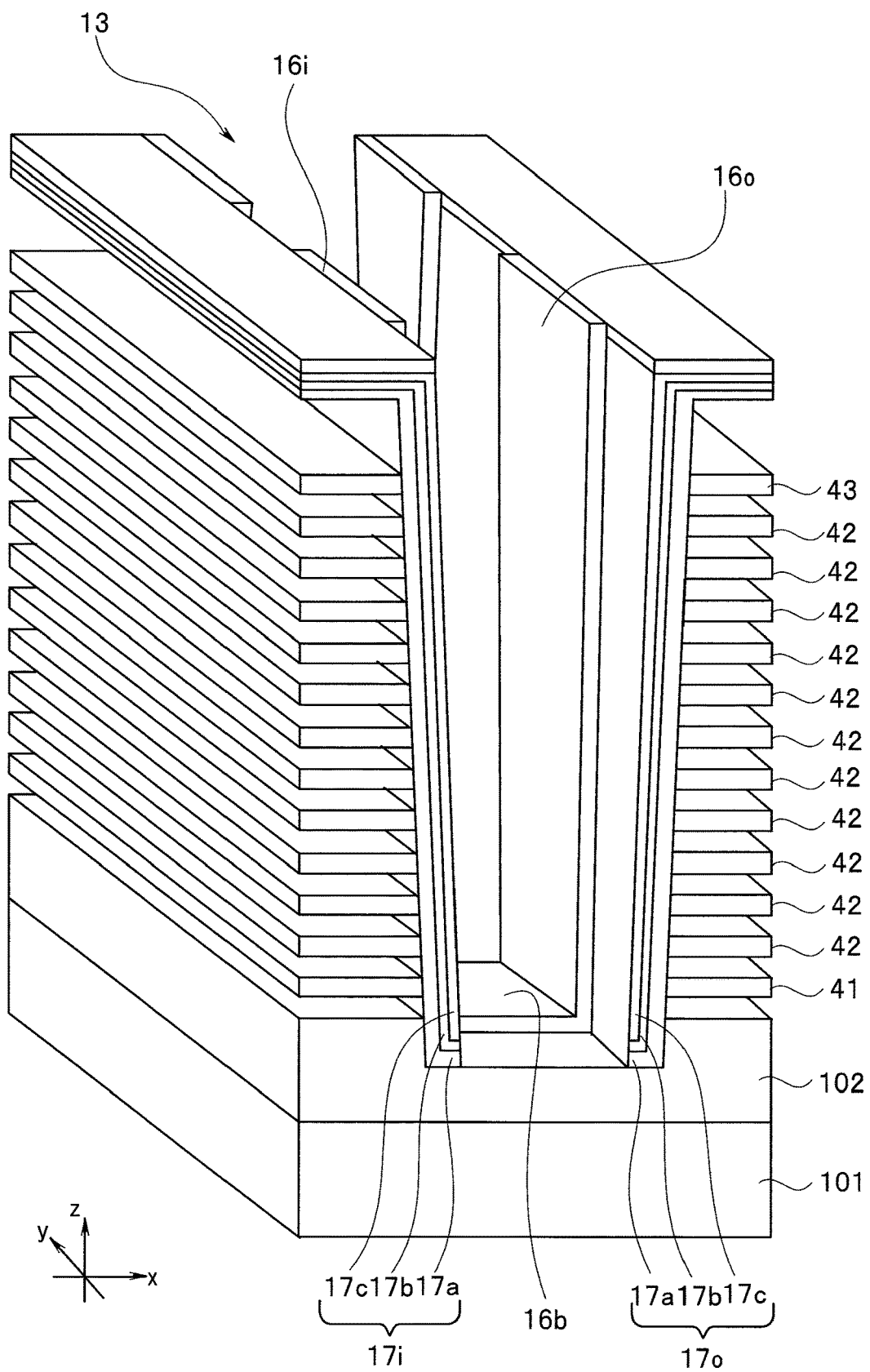
FIG. 4 is a perspective view illustrating a structure in a trench for memory.
Figure 5:
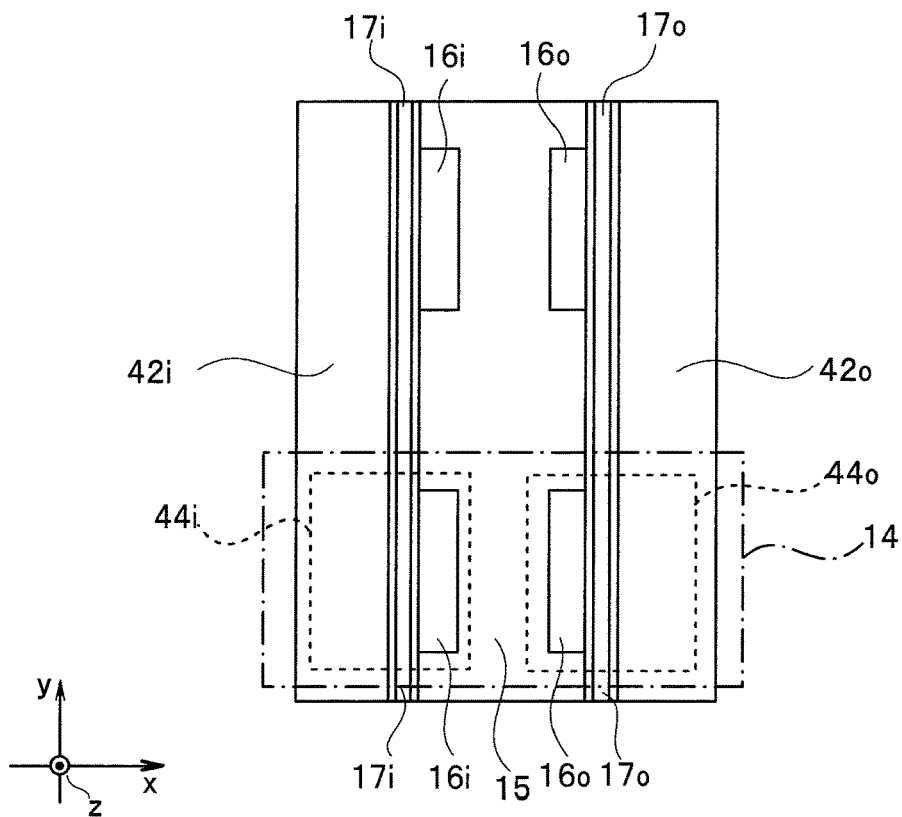
FIG. 5 is a cross-sectional view of a partial region of the trench for memory.

A structure in the trench for memory 13 will be further described with reference to FIGS. 4 and 5. FIG. 4 is a perspective view illustrating a structure in the trench for memory. FIG. 5 is a cross-sectional view of a partial region of the trench for memory. FIG. 5 illustrates an example of a cross-sectional structure when the trench for memory is cut along a surface horizontal with respect to the xy plane in any of the wiring layers 42. As illustrated in FIG. 4, the charge storage film 17 has a structure in which three layers, i.e., a tunnel insulating layer 17a, a charge storage layer 17b, and a block insulating layer 17c are stacked. The channel formation film 16 is composed of polysilicon, for example, and functions as a region where a channel is formed when the memory cell transistors MT and the select gate transistors ST1 and ST2 included in the memory string formation section 44 operate. In other words, the one channel formation film 16 is provided for each of the memory string formation sections 44. In other words, a plurality of strip-shaped channel formation films 16 each having a predetermined width in the y-direction and extending in the z-direction are formed on a surface of the charge storage film 17. As illustrated in FIG. 5, each of the channel formation films 16 is formed with a predetermined spacing from the other channel formation film 16 adjacent thereto in the y-direction.

The channel formation film 16 can be formed as described below, for example. First, the wiring layers 41, 42, and 43 are stacked while a silicon oxide film as an insulating film is sandwiched therebetween, and the trench for memory 13 is then formed by trench processing. The tunnel insulating film 17a, the charge storage layer 17b, and the block insulating layer 17c are sequentially evaporated on a side surface of the trench for memory 13, to form the charge storage film 17. The charge storage film 17 in a bottom portion of the trench for memory 13 is removed using anisotropic etching (e.g., RIE (reactive ion etching)), to expose the conductive layer 102. Then, polysilicon is evaporated on the charge storage film 17 and the charge storage layer 102 in the bottom portion of the trench for memory 13, and polysilicon in a region other than a region where the memory string formation section 44 is formed is removed using anisotropic etching (e.g., RIE), to form the channel formation film 16 separated for each of the memory string formation sections 44.

When the channel formation films 16 is thus formed, the individual memory string formation sections 44 are respectively formed on one side and the other side in the width direction (x-direction) of the trench for memory 13 when viewed in the longitudinal direction (y-direction) of the trench for memory 13. The memory string formation section 44 formed along a sidewall on the one side (the left side in FIGS. 3, 4, and 5) in the width direction (x-direction) of the trench for memory 13 is also referred to as a front-side memory string formation section 44i or an inside memory string formation section 44i. The memory string formation section 44 formed along a sidewall on the other side (the right side in FIGS. 3, 4, and 5) in the width direction (x-direction) of the trench for memory 13 is also referred to as a rear-side memory string formation section 44o or an outside memory string formation section 44o. If a front side and a rear side need to be also identified for each of components (the channel formation film 16, the charge storage film 17, etc.) included in each of the memory string formation sections 44, a suffix is attached to a reference numeral. In other words, the channel formation film 16i and the charge storage film 17*i* respectively represent components in the front-side memory string formation section 44*i*, and the channel formation film 16*o* and the charge storage film 17*o* respectively represent components in the rear-side memory string formation section 44*o*. The channel formation film 16*i* and the channel formation film 16*o*, which oppose each other, are electrically connected to the conductive layer 102 via the channel formation film 16*b* formed in the bottom portion of the trench for memory 13.

Note that respective definitions of the front-side (inside) memory string formation section 44*i* and the rear-side (outside) memory string formation section 44*o* are merely for convenience, and do not affect an operation in the present embodiment even if both the definitions are replaced with each other.

Figure 6:
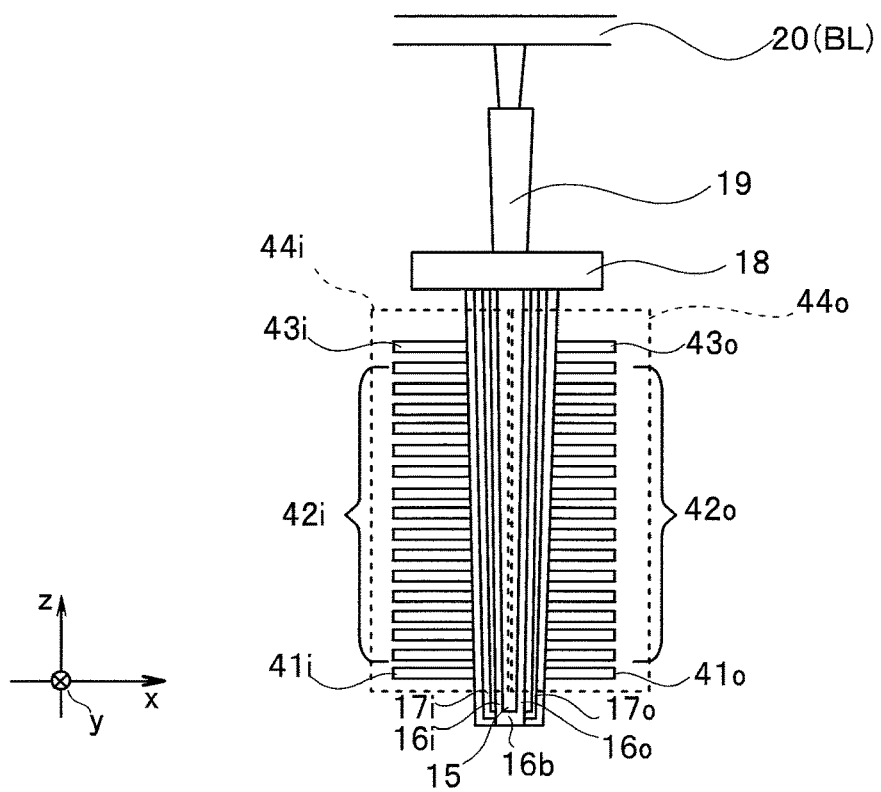
FIG. 6 is a schematic sectional view for describing a structure of a memory string structure.

FIG. 6 is a schematic sectional view for describing a structure of a memory string structure. As illustrated in FIG. 6, a pair of memory string formation sections 44 including the front-side memory string formation section 44*i* and the rear-side memory string formation section 44*o* is connected to the one conductive film 20 (the bit line BL) via the connection section 18 and the contact plug 19. Selection of a cell as a reading/writing target is controlled by wiring layers 43*i* and 43*o* (select gate lines SGD0 and SGD1). If the memory cell transistor MTi included in the front-side memory string formation section 44*i* is desired to be selected, for example, a current is applied to the wiring layer 43*i* (the select gate line SGD0) to turn on the select gate transistor ST1, and the bit line BL is electrically connected to the channel formation film 16*i* in the front-side memory string formation section 44*i*.

Figure 7:
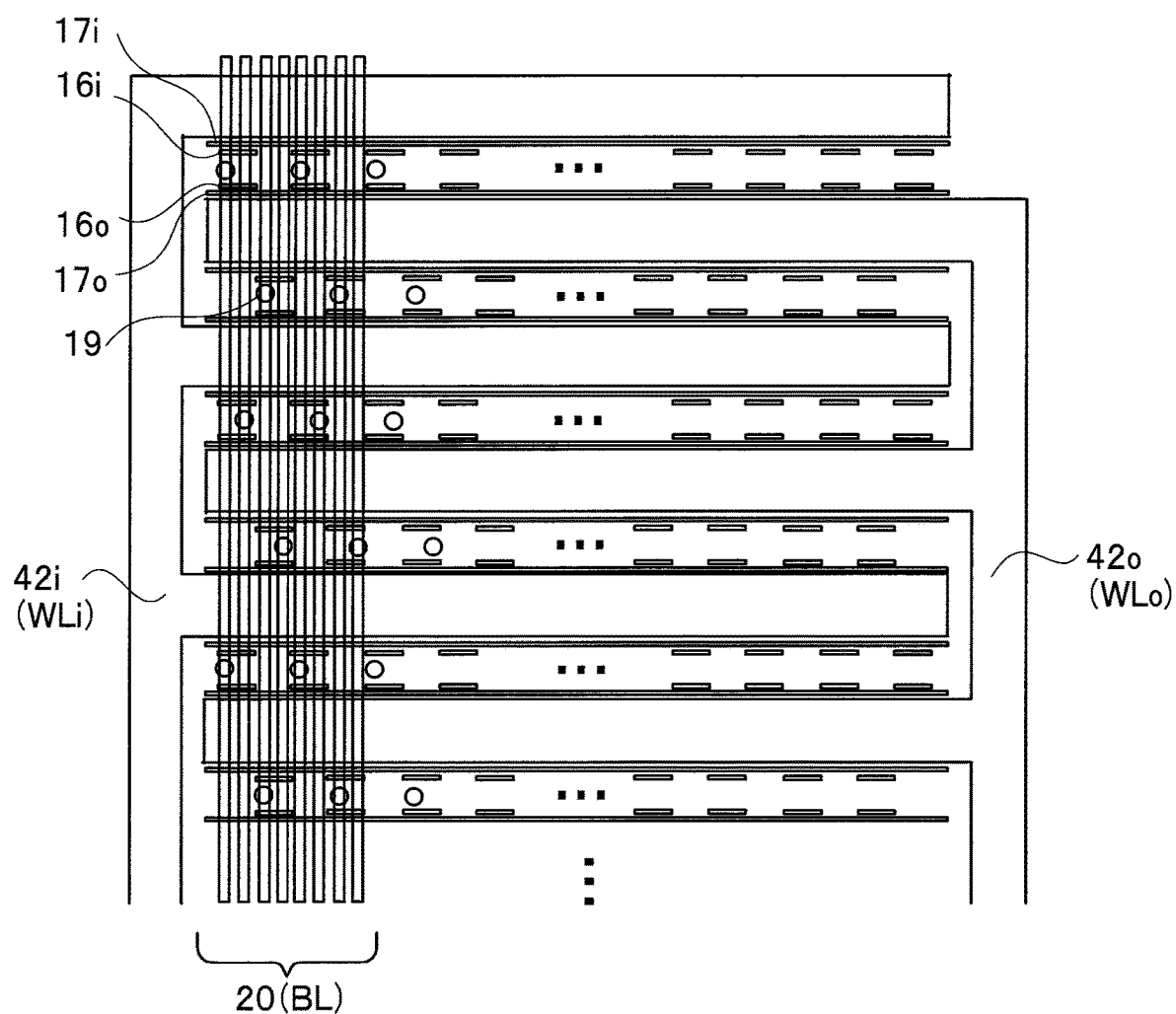
FIG. 7 is a diagram illustrating a planar structure of word lines WL in a NAND memory cell array.
Figure 8:
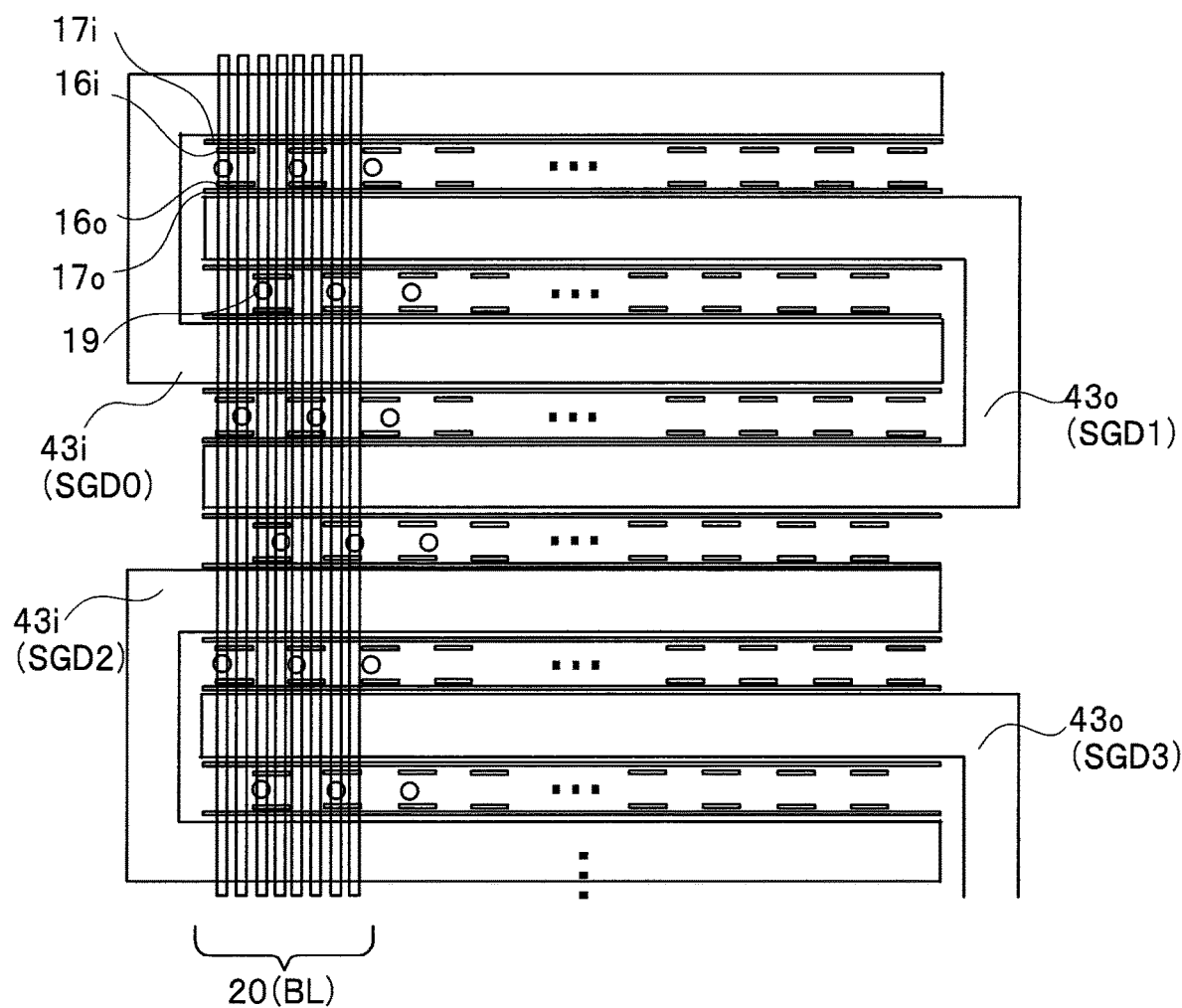
FIG. 8 is a diagram illustrating a planar structure of select gate lines SGD in the NAND memory cell array.

A planar layout of the NAND memory cell array 21 will be described. FIG. 7 illustrates a planar structure of the word lines WL in the NAND memory cell array. FIG. 8 illustrates a planar structure of the select gate lines SGD in the NAND memory cell array.

First, the planar structure of the word lines WL will be described. In the NAND memory cell array 21 in the present embodiment, the word lines WL in the front-side memory string formation section 44*i* and the word lines WL in the rear-side memory string formation section 44*o* need to be individually controlled. Therefore, as illustrated in FIG. 7, the odd-numbered word lines WLi, e.g., the first, third, fifth, . . . word lines WLi from above in the drawing among the word lines WL separated by the trench for memory 13 and extending in the y-direction extend to a region on one side (the left side in FIG. 7) in the y-direction of a region where the trench for memory 13 is formed, and are connected to one another in the extending region. The even-numbered word lines WLo, e.g., the second, fourth, sixth, . . . word lines from above in the drawing extend to a region on the other side (the right side in FIG. 7) in the y-direction of the region where the trench for memory 13 is formed, and are connected to one another in the extending region.

In other words, the wiring layer 42 includes the two sets of word lines WLi and WLo each having a comb shape, and the word line WLi and the word line WLo are arranged in such a shape that respective teeth of combs are made to engage with each other. The trench for memory 13 is formed between the word line WLi and the word line WLo, and the front-side memory string formation section 44*i* intersecting the word line WLi and extending in the z-direction and the rear-side memory string formation section 44*o* intersecting the word line WLo and extending in the z-direction are formed to oppose each other with the insulating film 15 interposed therebetween in the width direction (x-direction) of the trench for memory 13.

Then, the planar structure of the select gate lines SGD will be described. In the NAND memory cell array 21 in the present embodiment, a plurality of memory string structures 14 connected to the one bit line BL need to be individually controlled. Therefore, as illustrated in FIG. 8, the odd-numbered select gate lines SGD, e.g., the first, third, fifth, . . . select gate lines from above in the drawing among the select gate lines SGD separated by the trench for memory 13 and extending in the y-direction extend to a region on the one side (the left side in FIG. 8) in the y-direction of a region where the trench for memory 13 is formed, and the two adjacent select gate lines SGD are connected to each other in the extending region. The even-numbered select gate lines SGD, e.g., the second, fourth, sixth, . . . select gate lines from above in the drawing extend to a region on the other side (the right side in FIG. 8) in the y-direction of a region where the trench for memory 13 is formed, and the two adjacent select gate lines SGD are connected to each other in the extending region.

In other words, the first and third select gate lines SGD0 from above in the drawing are connected to each other, and the second and fourth select gate lines SGD1 from above in the drawing are connected to each other. Similarly, the alternate select gate lines SGD are connected to each other. The select gate lines SGD0, SGD1, . . . each have a U shape having an opening portion at one end in the y-direction, and the two adjacent select gate lines are arranged in a shape in which both the opening portions are made to engage with each other. For example, the select gate line SGD0 having an opening portion on one side in the y-direction (the right side in FIG. 8) and the select gate line SGD1 having an opening portion on the other side in the y-direction (the left side in FIG. 8) are arranged such that the respective opening portions engage with each other when viewed in the z-direction. When viewed in the z-direction, the select gate line SGD0, the select gate line SGD1, the select gate line SGD0, and the select gate line SGD1 are sequentially arranged from one side in the x-direction (the upper side in FIG. 8) toward the other side in the x-direction (the lower side in FIG. 8).

The bit lines BL are provided to extend in the x-direction and to be perpendicular to the select gate lines SGD0, SGD1, SGD2, . . . . The bit lines BL are connected to the front-side memory string formation section 44*i* and the rear-side memory string formation section 44*o* included in the memory string structure 14 sandwiched between the two adjacent select gate lines among the select gate lines SGD0, SGD1, SGD2, . . . with one contact plug 19 interposed therebetween. The plurality of memory string structures 14 respectively individually controlled by the select gate lines SGD0, SGD1, SGD2, . . . are connected to the one bit line BL. Note that the front-side memory string formation section 44*i* and the rear-side memory string formation section 44*o* constituting the memory string structure 14 are respectively controlled by the separate select gate lines SGD. For example, the memory string structure 14 positioned in an upper left end portion is connected to the bit line BL at a left end via the contact plug 19 in FIG. 8. The front-side memory string formation section 44*i* in the memory string structure 14 is controlled by the select gate line SGD0. On the other hand, the rear-side memory string formation section 44*o* in the memory string structure 14 is controlled by the select gate line SGD1.

Figure 9:
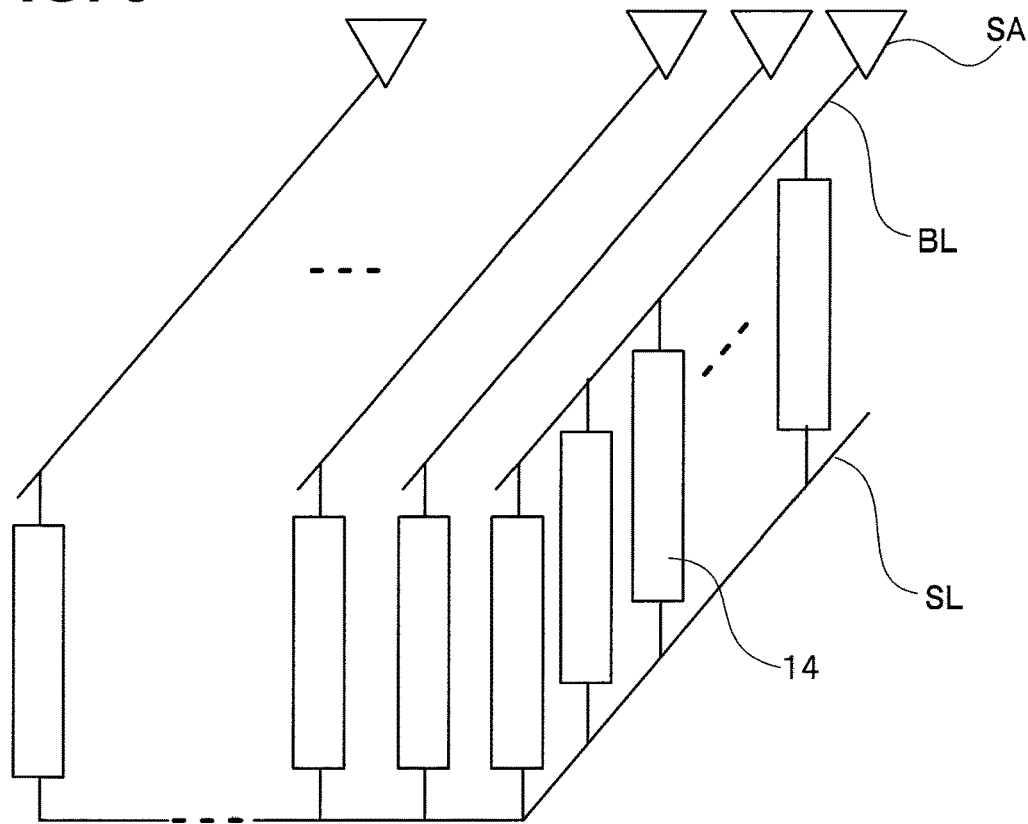
FIG. 9 is a diagram for describing a connection relationship between a bit line and the memory string structure.

Then, a data reading operation in the above-described NAND memory cell array 21 will be described. FIG. 9 is a diagram for describing a connection relationship between a bit line and the memory string structure. As illustrated in FIG. 9, the one sense amplifier SA is connected to the one bit line BL. A cell current Icell flowing through the memory string formation section 44 selected by the select gate line SGD is detected, to differentiate data 0 and data 1.

Figure 10:
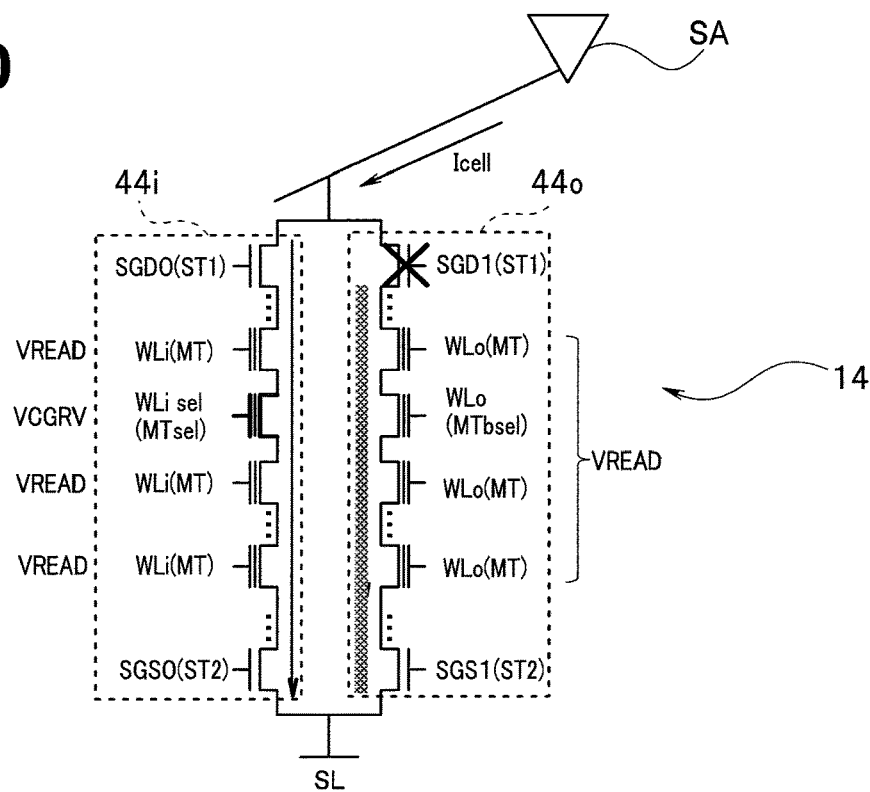
FIG. 10 is an equivalent circuit diagram of the memory string structure.

FIG. 10 is an equivalent circuit diagram of the memory string structure. In FIG. 10, the plurality of memory cell transistors MT included in the front-side memory string formation section 44i in the memory string structure 14 are respectively connected to the stacked word lines WLi, and the plurality of memory cell transistors MT included in the rear-side memory string formation section 44o are respectively connected to the stacked word lines WLo. If the memory cell transistor MT (hereinafter also referred to as a select cell MTsel) as a reading operation target is included in the front-side memory string formation section 44i, the word line WLi connected to the memory cell transistor MT functions as a select word line WLisel, and a voltage VCGRV as a reading reference is applied to the select word line WLisel. A high voltage VREAD (e.g., 8 volts), which is always on regardless of a threshold value of the memory cell transistor MT, is applied to the word lines WLi other than the select word line WLisel. A high voltage Vsg is applied to the select gate line SGD (e.g., the select gate line SGD0) connected to the select gate transistor ST1 included in the front-side memory string formation section 44i and the select gate line SGS (e.g., the select gate line SGS0) connected to the select gate transistor ST2. As a result, the select gate transistor ST1 and the select gate transistor ST2 included in the front-side memory string formation section 44i are also turned on.

If the memory cell transistor MT (a select cell MTsel) as a reading operation target is included in the rear-side memory string formation section 44o, the word line WLo connected to the memory cell transistor MT functions as a select word line WLosel, and a voltage VCGRV as a reading reference is applied to the select word line WLosel. A high voltage VREAD (e.g., 8 volts), which is always on regardless of a threshold value of the memory cell transistor MT, is applied to the word lines WLo other than the select word line WLosel. A high voltage Vsg is applied to the select gate line SGD (e.g., the select gate line SGD1) connected to the select gate transistor ST1 included in the rear-side memory string formation section 44o and the select gate line SGS (e.g., the select gate line SGS1) connected to the select gate transistor ST2. As a result, the select gate transistor ST1 and the select gate transistor ST2 included in the rear-side memory string formation section 44o are also turned on.

A case where the select cell MTsel is included in the front-side memory string formation section 44i will be described below as an example.

If a threshold value stored in the select cell MTsel is the voltage VCGRV or less, the select cell MTsel is turned on, and a large cell current Icell flows through the front-side memory string formation section 44i. On the other hand, if a threshold value stored in the select cell MTsel is the voltage VCGRV or more, the select cell MTsel is turned off, and a current hardly flows through the front-side memory string formation section 44i. In other words, a current flowing through the front-side memory string formation section 44i is determined depending on a state of the select cell MTsel. Therefore, when the cell current Icell is read by the sense amplifier SA, to determine whether or not the threshold value in the select cell MTsel is a reference value (the voltage VCGRV) or more, data 0 and data 1 can be differentiated.

The memory string structure 14 includes the front-side memory string formation section 44i and the rear-side memory string formation section 44o. Therefore, a current path by the channel formation film 16i in the front-side memory string formation section 44i and a current path by the channel formation film 16o in the rear-side memory string formation section 44o exist between the bit line BL and the source line SL. If data is read out of the memory cell transistor MT included in the front-side memory string formation section 44i, when a current flows through the source line from the bit line BL via the channel formation film 16o, the sense amplifier SA always detects a large cell current Icell, and cannot judge whether or not a current flows through the select cell MTsell. To prevent this, when data is read out of the memory cell transistor MT included in the front-side memory string formation section 44i, a current path by the channel formation film 16o in the rear-side memory string formation section 44o needs to be disconnected in at least one portion. For example, a low voltage (a ground voltage Vss, e.g., 0 volts) is applied to the select gate line SGD1 in the rear-side memory string formation section 44o, to turn off the select gate transistor ST1. As a result, the current path by the channel formation film 16o in the rear-side memory string formation section 44o is disconnected by the select gate transistor ST1.

On the other hand, a voltage at which the select gate transistor ST2 is turned on is applied to the select gate line SGS1 connected to the select gate transistor ST2 included in the rear-side memory string formation section 44o. A high voltage VREAD (e.g., 8 volts), which is always on regardless of a threshold value of the memory cell transistor MT, is applied to the word line WLo connected to the memory cell transistor MT included in the rear-side memory string formation section 44o. As a result, a channel is formed partially, i.e., from the source line to the memory cell transistor MT positioned on the uppermost side (to a position just below the select gate transistor ST1) in the channel formation film 16o in the rear-side memory string formation section 44o, and a potential of the channel is fixed to a source line potential.

In the memory string structure 14 in the present embodiment, the channel formation film 16i in the front-side memory string formation section 44i and the channel formation film 16o in the rear-side memory string formation section 44o oppose each other with the insulating film 15 interposed therebetween in the width direction (the x-direction) of the trench for memory 13. Therefore, when a reading operation is performed to the memory cell transistor TM included in the front-side memory string formation section 44i, a channel of the select cell MTsel is affected by a charge held by a memory cell transistor MT included in the rear-side memory string formation section 44o and facing (at the same height in the z-direction as the height of) the select cell MTsel (hereinafter also referred to as a back opposite cell MTbsel). When a voltage is applied to the select word line WLisel, for example, the select cell MTsel may be turned off due to an effect of the charge held in the charge storage film 17o in the back opposite cell MTbsel even if originally turned on. On the other hand, the select cell MTsel may be turned on due to an effect of the charge held in the charge storage film 17o in the back opposite cell MTbsel if turned off by a voltage applied to the select word line WLisel. Accordingly, an effective threshold value in the select cell MTsel may vary by coupling between the select cell MTsel and the back opposite cell MTbsel. An amount of the variation depends on a relationship between the threshold value in the select cell MTsel (an amount of the charge held in the charge storage film 17i) and the threshold value in the back opposite cell MTbsel (an amount of the charge held in the charge storage film 17o), and the memory cell transistors MT belonging to the same cell unit CU are not uniform in magnitude and directivity of the effect. Therefore, even if a voltage to be applied to the select word line WLisel is adjusted, for example, the effect cannot be removed.

In the present embodiment, a partial channel is formed in the channel formation film 16o in the rear-side memory string formation section 44o, and a potential of the channel is fixed to a source line potential. As a result, the channel to be formed in the channel formation film 16o in the rear-side memory string formation section 44o functions as a shield. Thus, interference with the select cell MTsel by the charge to be held in the charge storage film 17o in the back opposite cell MTbsel is suppressed so that erroneous reading can be prevented.

Then, a memory string structure 14 having a two-layer structure will be described. For example, a three-dimensional NAND flash memory can be formed by integrally processing the trench for memory 13 after the wiring layer 41 as the select gate line SGS, the plurality of wiring layers 42 as the word lines, and the wiring layer 43 as the select gate line SGD are stacked. However, in the three-dimensional NAND flash memory in which the number of stacked layers is large, for example, an aspect ratio becomes high when the trench for memory 13 is processed, and the processing may be difficult. To release the aspect ratio when the trench for memory 13 is processed, processes for stacking the wiring layers to 43 to form the trench for memory 13 may be performed a plurality of times.

Figure 11A:
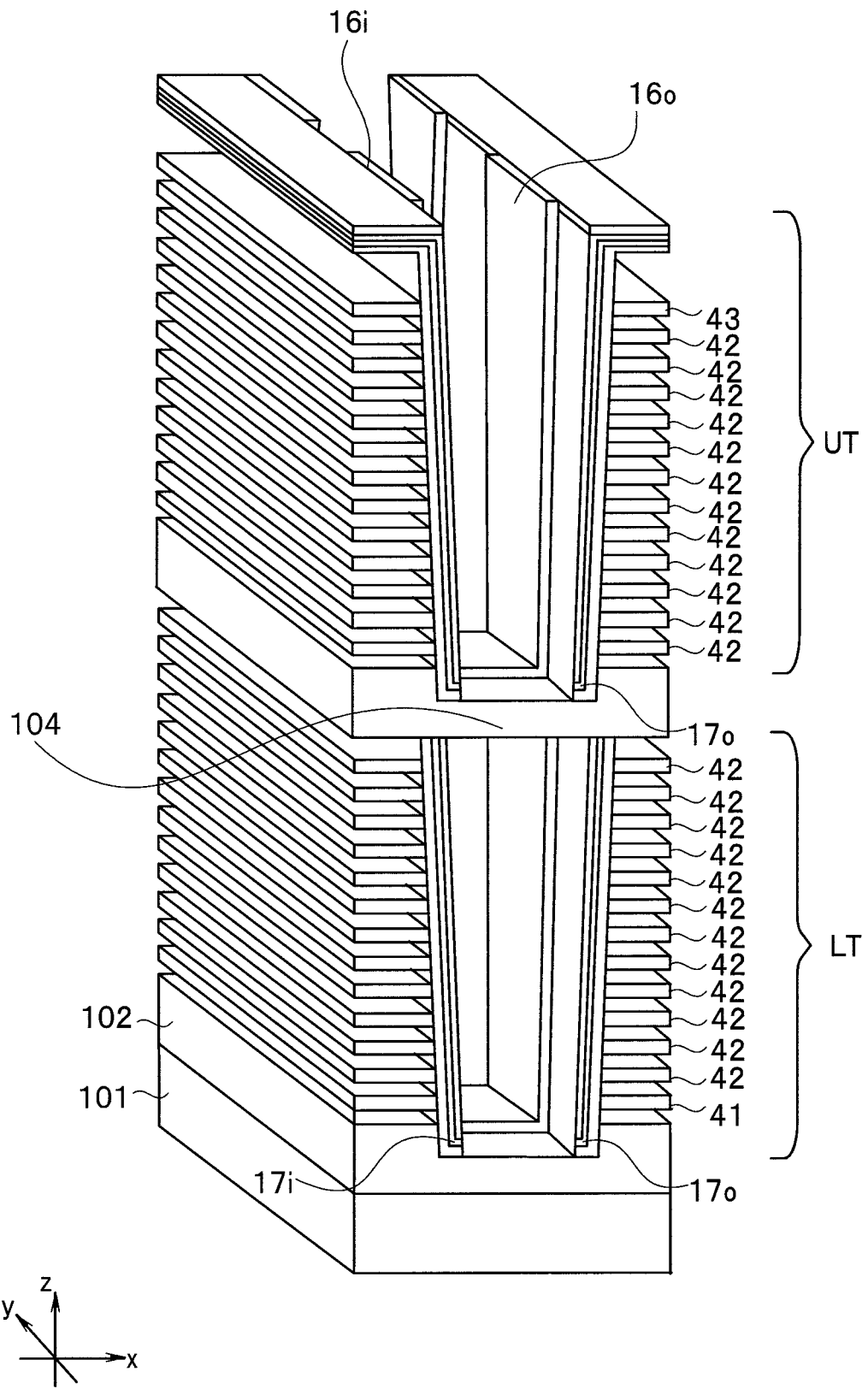
FIG. 11A is a schematic sectional view for describing a structure of a memory string structure having a two-layer structure.
Figure 11B:
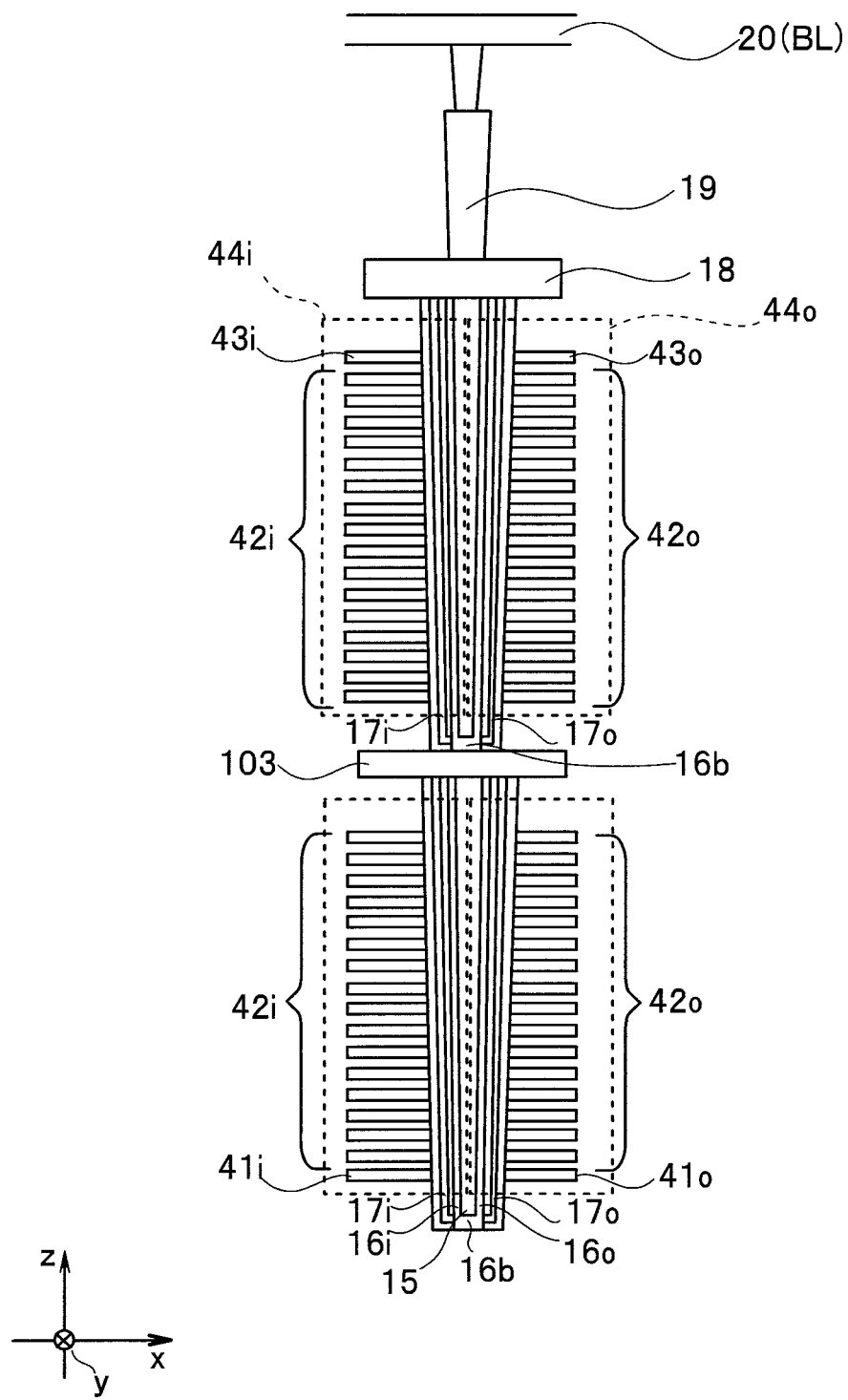
FIG. 11B is a schematic sectional view for describing the structure of the memory string structure having a two-layer structure.

A memory string structure 14 having a two-layer structure formed by stacking the wiring layers 41 to 43 and processing the trench for memory 13 two times will be described as an example. FIGS. 11A and 11B are schematic sectional views each describing a structure of the memory string structure having a two-layer structure. The memory string structure 14 having a two-layer structure has a structure in which a partial conductive layer 103 referred to as a joint portion is sandwiched between a lower layer portion (lower tier) LT and an upper layer portion (upper tier) UT. In other words, after the wiring layer 41 as the select gate line SGS and the plurality of wiring layers 42 as some of the word lines are stacked, the trench for memory 13 is processed, to form the lower layer portion LT. Then, an insulating layer 104 is formed on an entire surface of the wafer. Then, a part of the insulating film 104 is removed, an upper end of a channel formation film 16i and an upper end of a channel formation film 16o, which oppose each other, in the lower layer portion LT are electrically connected to each other, and a partial conductive layer 103 for electrically connecting the upper layer portion UT with the lower layer portion LT is formed, to form a joint portion JL. Then, the plurality of wiring layers 42 as the remaining word lines and the wiring layer 43 as the select gate line SGD are stacked, and the trench for memory 13 is then processed, to form the upper layer portion UT. Therefore, in a memory string structure 14 having a stacked structure as illustrated in FIG. 11, there exists a portion (a joint portion JL) in which a channel in the front-side memory string formation section 44i and a channel in the rear-side memory string formation section 44o are rendered conductive in the middle.

Figure 12:
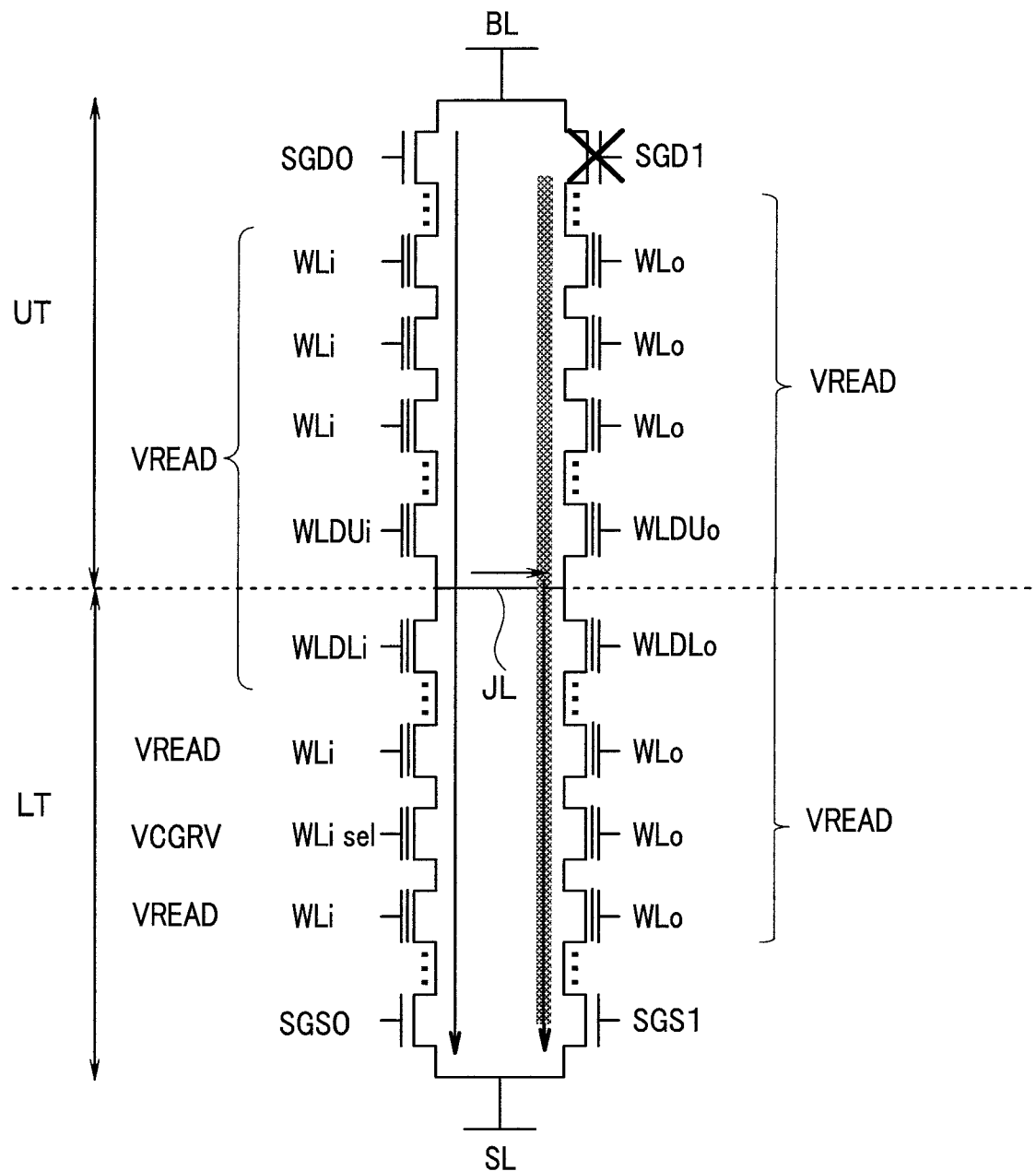
FIG. 12 is a diagram for describing a data reading operation in a first embodiment.
Figure 13:
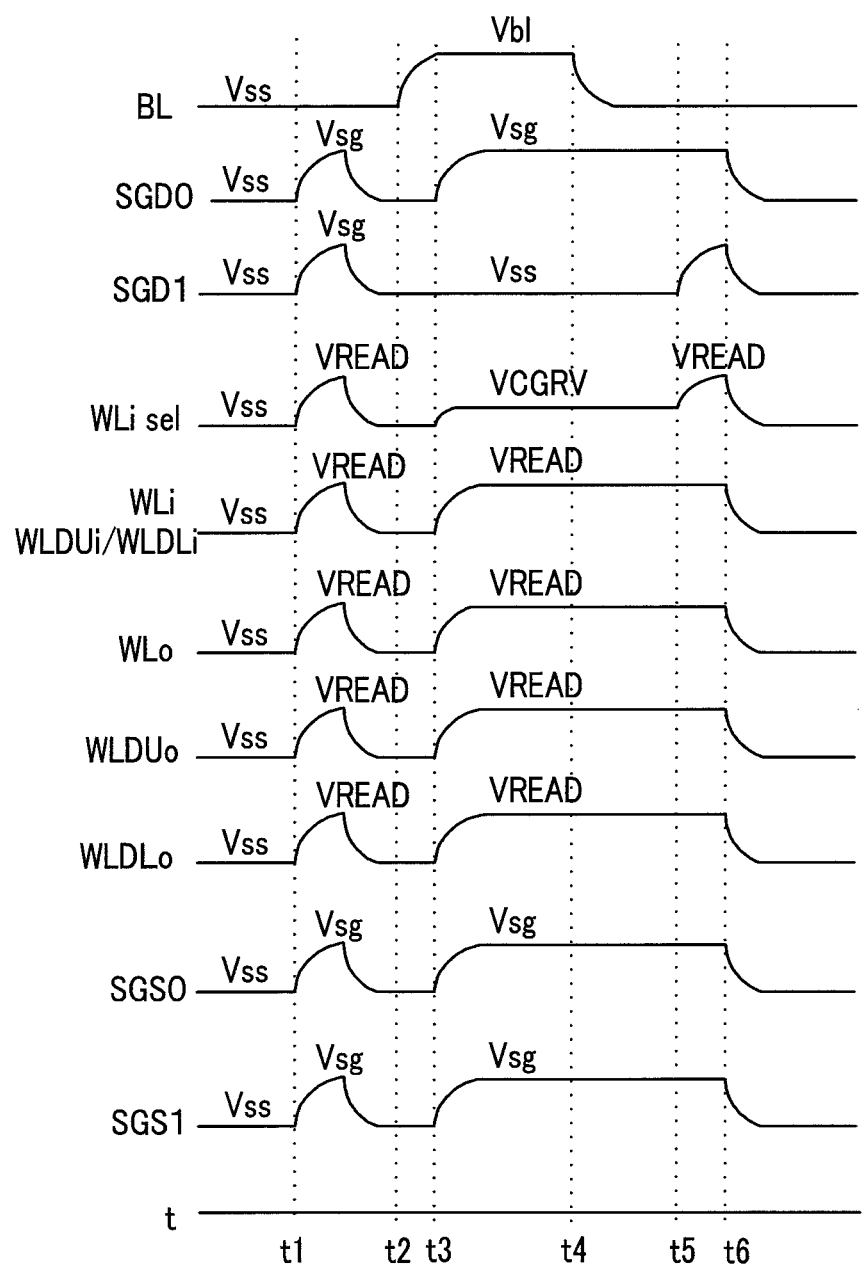
FIG. 13 is a diagram for describing a data reading operation in the first embodiment.

A data reading operation in the memory string structure 14 having such a stacked structure will be described with reference to FIGS. 12 and 13. FIGS. 12 and 13 are diagrams for describing a memory reading method in the first embodiment. FIG. 12 illustrates a voltage to be applied to each of transistors at the time of reading. FIG. 13 illustrates a voltage application timing at the time of reading in each of wiring layers.

In the present embodiment, a partial channel is formed in the channel formation film 16 in the memory string formation section 44 (e.g., the rear-side memory string formation section 44i) facing the memory string formation section 44 (e.g., the front-side memory string formation section 44i) including the select cell MTsel with a center line of the trench for memory 13 interposed therebetween, and the channel is fixed to a source line potential, to suppress interference from the back opposite cell MTbsel. In the memory string structure 14 having a two-layer structure including the joint portion JL, the memory cell transistor MT just above/just below the joint portion JL differs in periodicity from the other memory cell transistors MT. Accordingly, the memory cell transistor MT just above/just below the joint portion JL is handled as a dummy cell transistor DT (a transistor configured not to perform data writing/reading), for example. The word line WL to be connected to the dummy cell transistor DT just above the joint portion JL is set as word lines WLDUi and WLDUo, and the word line WL connected to the dummy cell transistor DT just below the joint portion JL is set as word lines WLDLi and WLDLo. Note that the plurality of memory cell transistors MT just above/just below the joint portion JL may be each handled as a dummy cell transistor DT, and the number of the dummy cell transistors DT is not limited. The embodiment will be described below using a case where the select cell MTsel is arranged in the lower layer portion LT in the front-side memory string formation section 44i as an example.

As illustrated in FIG. 12, on the side of the front-side memory string formation section 44i, a voltage VCGRV as a reading reference is applied to a word line WLisel connected to the select cell MTsel. At this time, a high voltage \TREAD, which is always on regardless of a threshold value of the memory cell transistor MT, is applied to word lines WLi, WLDLi, and WLDUi other than the word line WLisel connected to the select cell MTsel. A voltage (Vsg), at which the select gate transistor ST1 is turned on, is applied to the select gate line SGD0. A voltage (Vsg), at which the select gate transistor ST2 is turned on, is applied to the select gate line SGS0.

On the other hand, on the side of the rear-side memory string formation section 44o, a voltage, which is always on regardless of a threshold value of the memory cell transistor MT, is applied to word lines WLo, WLDLo, and WLDUo connected to the memory cell transistors MT and the dummy cell transistor DT. A low voltage (a ground voltage Vss, e.g., 0 volts) is applied to the select gate line SGD1, to turn off the select gate transistor ST1. A voltage, at which the select gate transistor ST2 is turned on, is applied to the select gate line SGS1. When a voltage is thus applied to each of the cells in the rear-side memory string formation section 44o, a channel is formed in the channel formation film 16o in the rear-side memory string formation section 44o, and a potential of the channel is fixed to a source line potential.

A voltage application timing to each of wiring layers at the time of reading in the present embodiment will be described with reference to FIG. 13. First, at a time t1, a voltage Vsg is applied to the select gate lines SGD0, SGD1, SGS0, and SGS1, to turn on the select gate transistors ST1 and ST2, and a voltage VREAD is applied to all the word lines WL and dummy word lines WLD in the front-side memory string formation section 44i and the rear-side memory string formation section 44o. As a result, a reset operation for extracting a charge remaining on a channel, for example, is performed by setting all the memory cell transistors MT and dummy cell transistors DT to an on state.

After the reset operation, respective voltages of the select gate lines SGD0, SGD1, SGS0, and SGS1 and all the word lines WL and dummy word lines WLD are each dropped to a ground voltage (Vss) in a period elapsed since the reset operation until a reading operation start timing (t3). Note that the reset operation may not be performed.

Then, at a time t2, a bit line voltage Vb1 at the time of reading is applied to the bit line BL. Note that a timing of the application may be a time t3. As a voltage to be applied to the bit line BL, Vb1 is maintained until a timing (t4) at which a reading operation is finished.

At the time t3, the reading operation is started. In other words, a voltage VCGRV as a reading reference is applied to a word line WLisel connected to the select cell MTsel. A voltage VREAD, which is always on regardless of a threshold value of the memory cell transistor MT, is applied to word lines WLi and WLo connected to the other memory cell transistors MT and word lines WLDLi, WLDUi, WLDLo, and WLDUo connected to the dummy cell transistors DT. A voltage Vsg is applied to the select gate lines SGD0, SGS0, and SGS1 to turn on the corresponding select gate transistors ST1 and ST2, and a ground voltage Vss is applied to the select gate line SGD0 to turn off the select gate transistor ST1. In such a bias state, a current Icell flowing through the memory string structure 14 is detected by the sense amplifier SA so that data stored in the select cell MTsel can be judged.

Then, after the voltage to be applied to the bit line BL is dropped to Vss to perform a reset operation at a time t4, a reset operation of the channel is performed again at a time t5. In other words, like at the time t1, the voltage Vsg is applied to the select gate lines SGD0, SGD1, SGS0, and SGS1 to turn on the select gate transistors ST1 and ST2, and a voltage VREAD is applied to all the word lines WL and dummy word lines WLD in the front-side memory string formation section 44i and the rear-side memory string formation section 44o to turn on all the memory cell transistors MT and dummy cell transistors DT and sweep a charge remaining on the channel. Note that the reset operation may not be performed.

Finally, at a time t6, all the potentials are reset to a ground potential Vss, to finish a series of operations for data reading. Note that such voltage control is performed by a control circuit (e.g., the sequencer 27) provided within the nonvolatile memory 2.

As described above, according to the present embodiment, when at the time of an operation for reading out the select cell MTsel, control is performed to turn off the select gate transistor ST1 in the rear-side memory string formation section 44o formed in the same memory string structure 14 including the front-side memory string formation section 44i to which the select cell MTsel belongs and turn on the other memory cell transistors MT, the dummy cell transistors DT, and the select gate transistor ST2 in the rear-side memory string formation section 44o, a channel potential of the rear-side memory string formation section 44o is fixed to a source line potential. Therefore, interference from the back opposite cell MTbsel is suppressed so that erroneous reading can be prevented. Accordingly, operation reliability can be increased.

Note that although a case where the select cell MTsel is positioned in the lower layer portion LT in the front-side memory string formation section 44i has been described above as an example, the present invention is also applicable to respective cases where the select cell MTsel is positioned in the upper layer portion UT in the front-side memory string formation section 44i and the upper layer portion UT and the lower layer portion LT in the rear-side memory string formation section 44o. In other words, at the time of the reading operation, in the memory string formation section 44 facing the memory string formation section 44 where the select cell MTsel is positioned, a similar effect is obtained when the select gate transistor ST1/ST2 provided in an opposite layer to the layer in which the select cell MTsel is positioned is turned off and the other memory cell transistors MT, the dummy cell transistors DT, and the other select gate transistor ST1/ST2 are turned on.

Second Embodiment

Then, a semiconductor storage apparatus according to a second embodiment of the present invention will be described. The semiconductor storage apparatus according to the present embodiment differs from the above-described semiconductor storage apparatus according to the first embodiment in a voltage to be applied to each of transistors at the time of a data reading operation. A configuration of the semiconductor storage apparatus according to the present embodiment is similar to the configuration of the above-described semiconductor storage apparatus according to the first embodiment, and hence description thereof is omitted, and a difference from the first embodiment will be described below.

Figure 14:
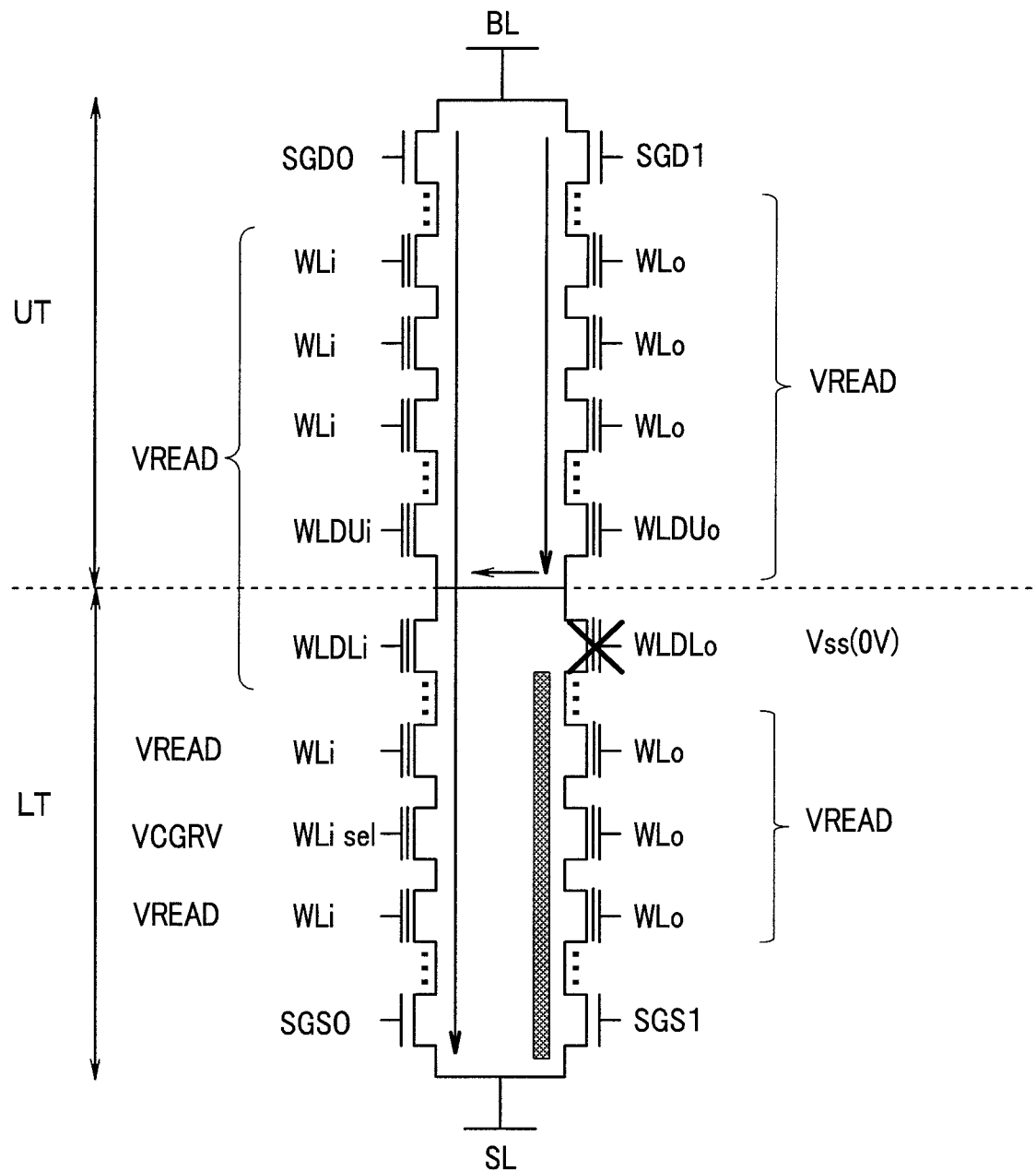
FIG. 14 is a diagram for describing a data reading operation in a second embodiment.
Figure 15:
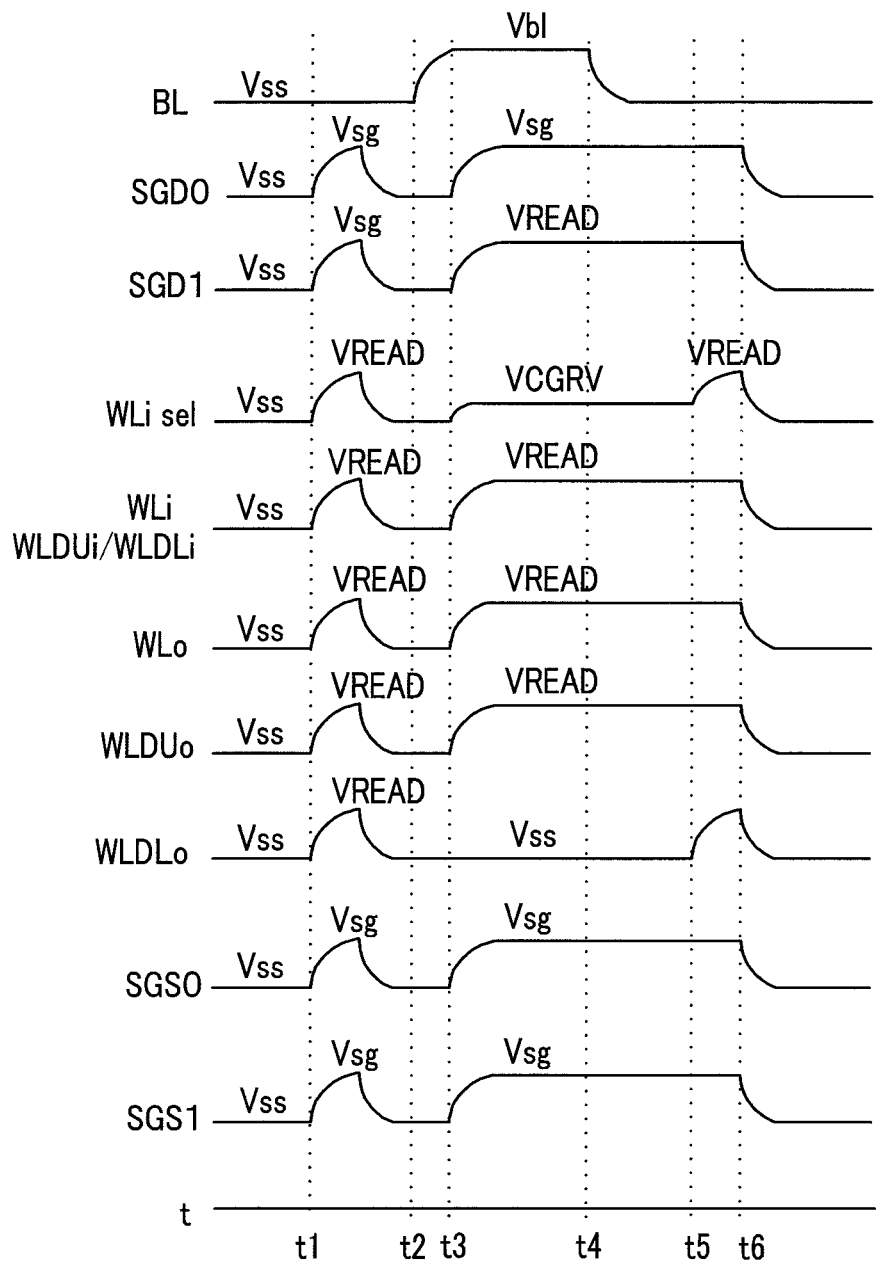
FIG. 15 is a diagram for describing a data reading operation in the second embodiment.
Figure 16:
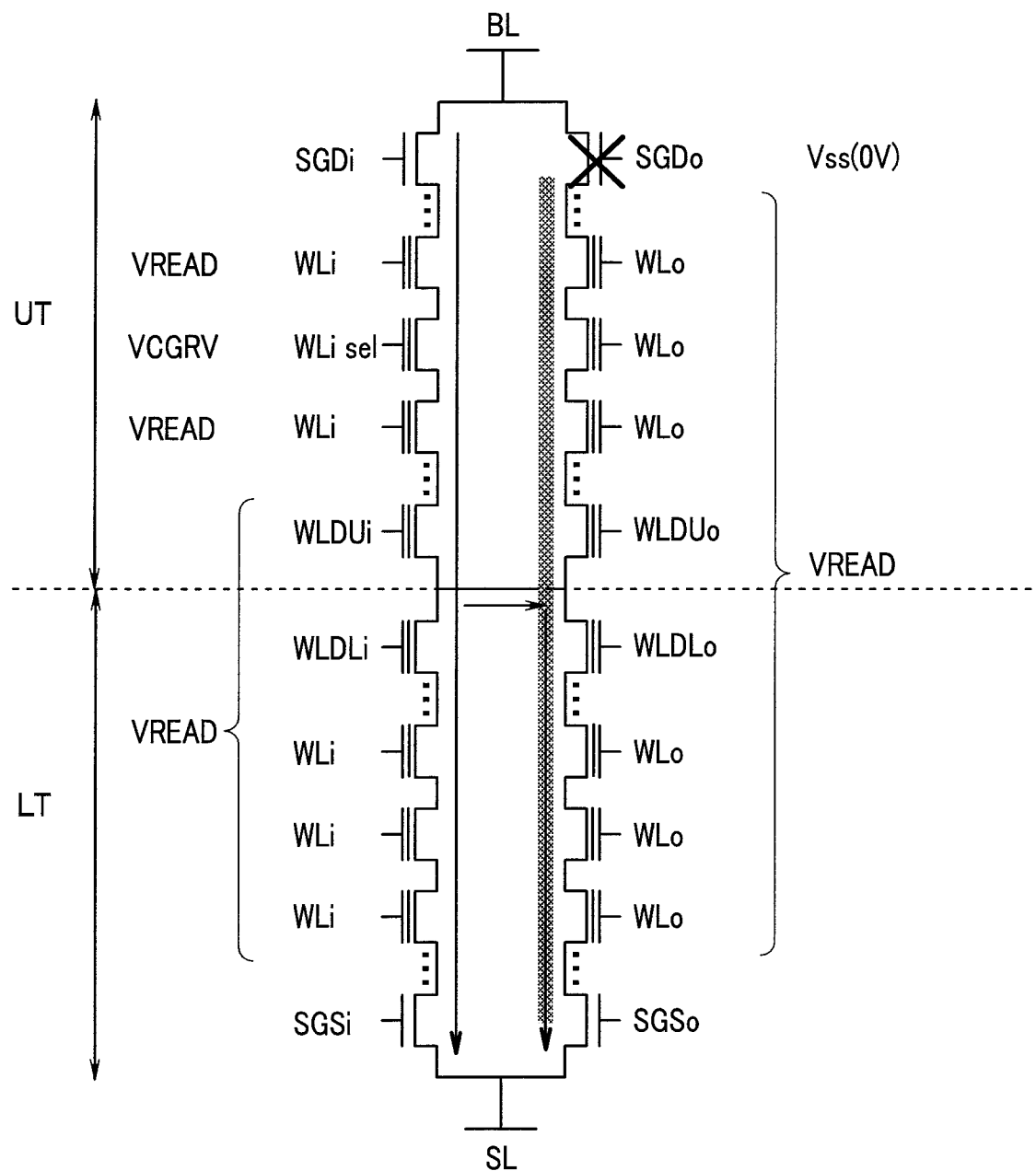
FIG. 16 is a diagram for describing a data reading operation in the second embodiment.
Figure 17:
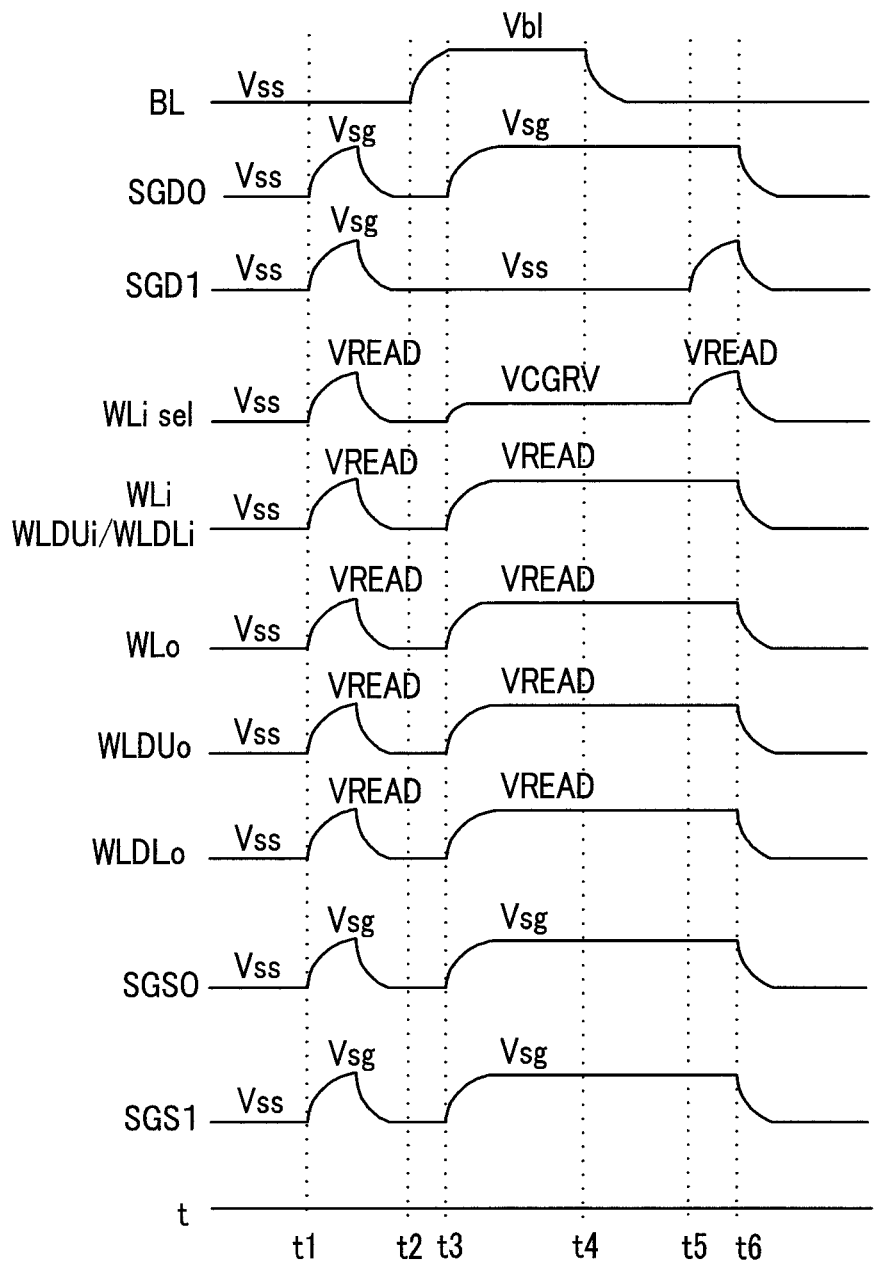
FIG. 17 is a diagram for describing a data reading operation in the second embodiment.

FIGS. 14, 15, 16, and 17 are diagrams for each describing a data reading method in the second embodiment. FIGS. 14 and 15 are explanatory diagrams of a case where a select cell MTsel is positioned in a lower layer portion LT in a front-side memory string formation section 44i. FIG. 14 illustrates a voltage to be applied to each of transistors at the time of reading. FIG. 15 illustrates a voltage application timing at the time of reading in each of wiring layers. FIGS. 16 and 17 are explanatory diagrams of a case where the select cell MTsel is positioned in an upper layer portion UT in the front-side memory string formation section 44i. FIG. 16 illustrates a voltage to be applied to each of transistors at the time of reading. FIG. 17 illustrates a voltage application timing at the time of reading in each of wiring layers.

Although in the memory string formation section 44 facing the memory string formation section 44 where the select cell MTsel is positioned, the transistor ST1/ST2 provided in the opposite layer to the layer where the select cell MTsel is positioned is turned off in the first embodiment, the present embodiment differs from the first embodiment in that in a memory string formation section 44 facing a memory string formation section 44 where the select cell MTsel is positioned, a transistor MT/DT/ST1/ST2 provided in the same layer as a layer where the select cell MTsel is positioned is turned off.

First, a case where the select cell MTsel is positioned in the lower layer portion LT in the front-side memory string formation section 44i will be described. As illustrated in FIG. 14, on the side of a rear-side memory string formation section 44o, a voltage (Vsg, VREAD), which is always on regardless of a threshold value of a memory cell transistor MT, is applied to a select gate transistor ST1 and word lines WLo and WLDUo connected to memory cell transistors MT and a dummy cell transistor DT positioned in the upper layer portion UT. On the other hand, although a voltage (VREAD, Vsg), which is always on, is applied to word lines WLo connected to the memory cell transistors MT and a select gate transistor ST2 positioned in the lower layer portion LT, a ground voltage Vss is applied to a word line WLDLo connected to a dummy cell transistor DT positioned just below a joint portion JL to turn off the dummy cell transistor DT.

In other words, as illustrated in FIG. 15, a voltage VCGRV as a reading reference is applied to a word line WLisel connected to the select cell MTsel at a time t3 as a reading start timing. A voltage VREAD, which is always on regardless of a threshold value of the memory cell transistor MT, is applied to word lines WLi and WLo connected to the other memory cell transistors MT and word lines WLDLi, WLDUi, and WLDUo connected to the dummy cell transistor DT. On the other hand, a voltage Vss is applied to a word line WLDLo connected to the dummy cell transistor DT, to turn off the dummy cell transistor DT. A voltage Vsg is applied to select gate lines SGD0, SGD1, SGS0, and SGS1, to turn on the corresponding select gate transistors ST1 or ST2. In such a bias state, a current Icell flowing through the memory string structure 14 is detected by the sense amplifier SA so that data stored in the select cell MTsel can be judged.

When a voltage is thus applied to each of the cells in the rear-side memory string formation section 44o, a channel is formed in the channel formation film 16o in the rear-side memory string formation section 44o, and a potential of the channel is fixed to a source line potential. A current path to the lower layer portion LT in the rear-side string formation section 44o from a channel in the upper layer portion UT in the front-side memory string formation section 44i via the joint portion JL is disconnected. Thus, a cell current Icell, which is always large, is detected by the sense amplifier SA only when the select cell MTsel is on, and a current is hardly detected when the select cell MTsel is off. Therefore, erroneous reading can be further prevented, and operation reliability can be improved.

Then, a case where the select cell MTsel is positioned in the upper layer portion UT in the front-side memory string formation section 44i will be described. As illustrated in FIG. 16, on the side of the rear-side memory string formation section 44o, a voltage (Vsg, VREAD), which is always on regardless of a threshold value of the memory cell transistor MT, is applied to the select gate transistor ST2 and word lines WLo and WLDLo connected to the memory cell transistors MT and the dummy cell transistor DT positioned in the lower layer portion LT. On the other hand, although a voltage (VREAD), which is always on, is applied to word lines WLo and WLDUo connected to the memory cell transistors MT and the dummy cell transistor DT positioned in the upper layer portion UT, a ground voltage Vss is applied to the select gate transistor ST1 to turn off the select gate transistor ST1.

In other words, as illustrated in FIG. 17, a voltage VCGRV as a reading reference is applied to a word line WLisel connected to the select cell MTsel at a time t3 as a reading start timing. A voltage VREAD, which is always on regardless of a threshold value of the memory cell transistor MT, is applied to word lines WLi and WLo connected to the other memory cell transistors MT and word lines WLDUi, WLDLo, and WLDUo connected to the dummy cell transistor DT. On the other hand, a voltage Vss is applied to the select gate line SGD1, to turn off the select gate transistor ST1. A voltage Vsg is applied to select gate lines SGD0, SGS0, and SGS1, to turn on the corresponding select gate transistors ST1. In such a bias state, a current Icell flowing through the memory string structure 14 is detected by the sense amplifier SA so that data stored in the select cell MTsel can be judged.

When a voltage is thus applied to each of the cells in the rear-side memory string formation section 44o, a channel is formed in the channel formation film 16o in the rear-side memory string formation section 44o, and a potential of the channel is fixed to a source line potential. A current path to the lower layer portion LT in the front-side memory string formation section 44i from a channel in the upper layer portion UT in the rear-side memory string formation section 44i via the joint portion JL is disconnected. Thus, a cell current Icell, which is always large, is detected by the sense amplifier SA only when the select cell MTsel is on, and a current is hardly detected when the select cell MTsel is off. Therefore, erroneous reading can be further prevented, and operation reliability can be improved.

Third Embodiment

Then, a semiconductor storage apparatus according to a third embodiment of the present invention will be described. The semiconductor storage apparatus according to the present embodiment differs from the above-described semiconductor storage apparatus according to the second embodiment in a voltage to be applied to each of transistors at the time of a data reading operation. A configuration of the semiconductor storage apparatus according to the present embodiment is similar to the configuration of the above-described semiconductor storage apparatus according to the first embodiment, and hence description thereof is omitted, and only a difference from the second embodiment will be described.

Figure 18:
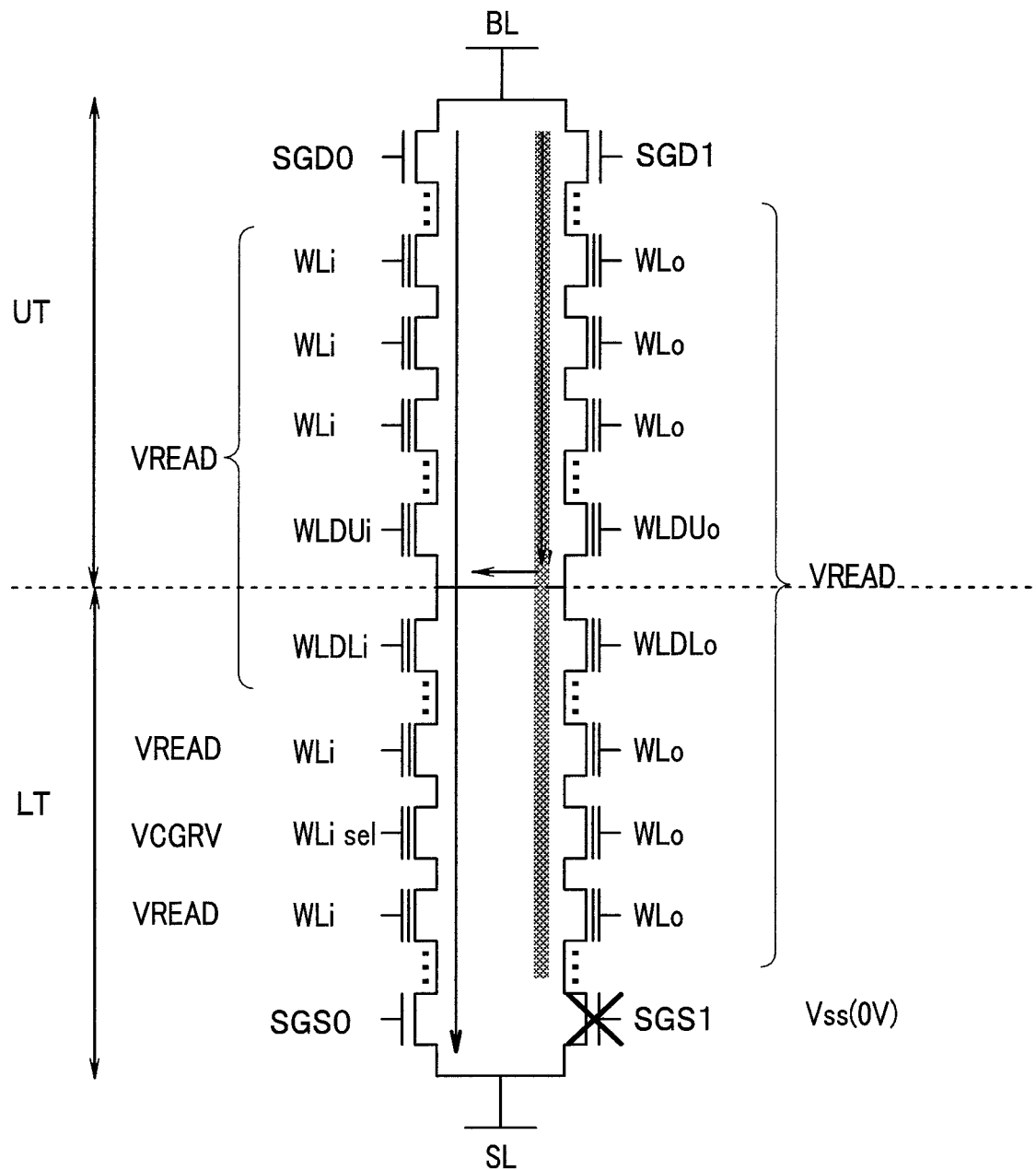
FIG. 18 is a diagram for describing a data reading operation in a third embodiment.
Figure 19:
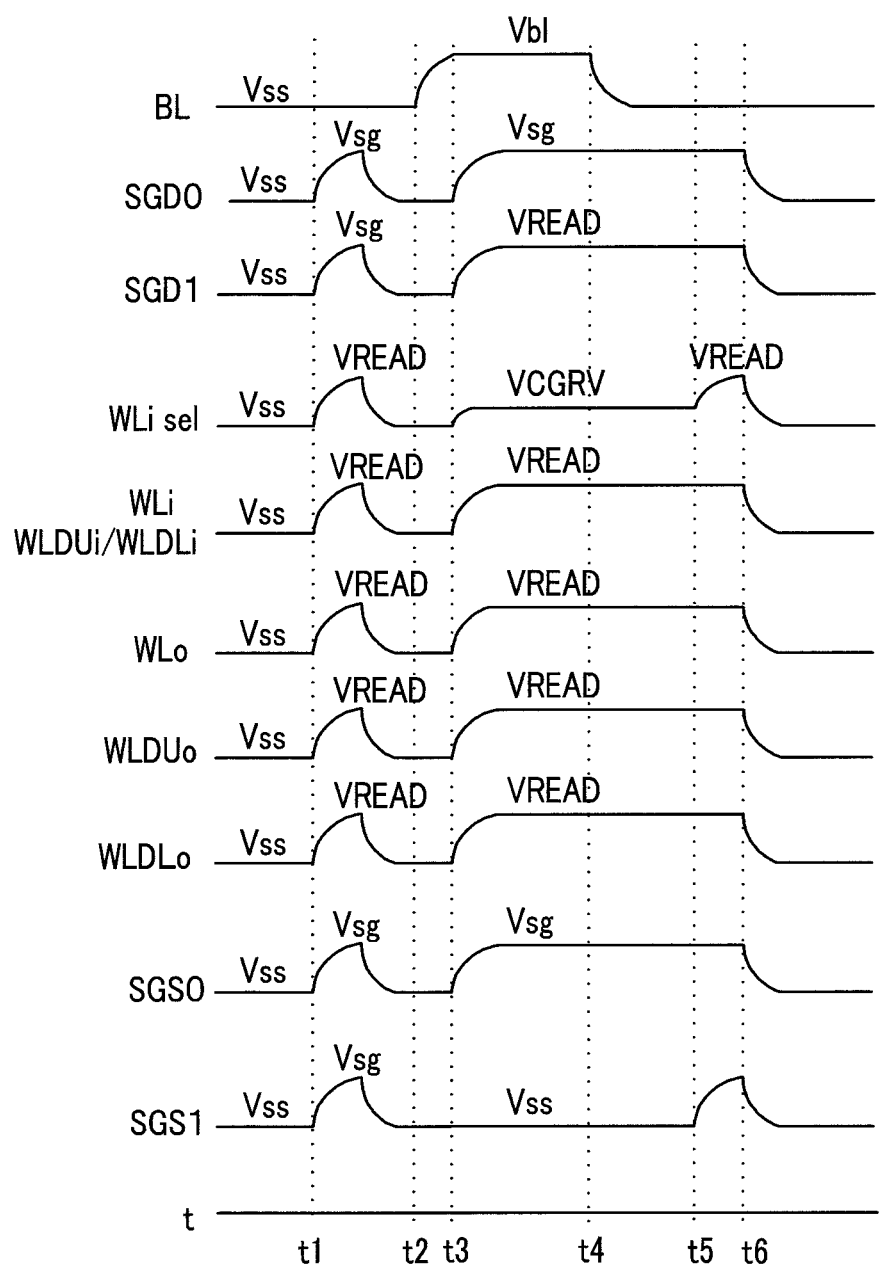
FIG. 19 is a diagram for describing a data reading operation in the third embodiment.
Figure 20:
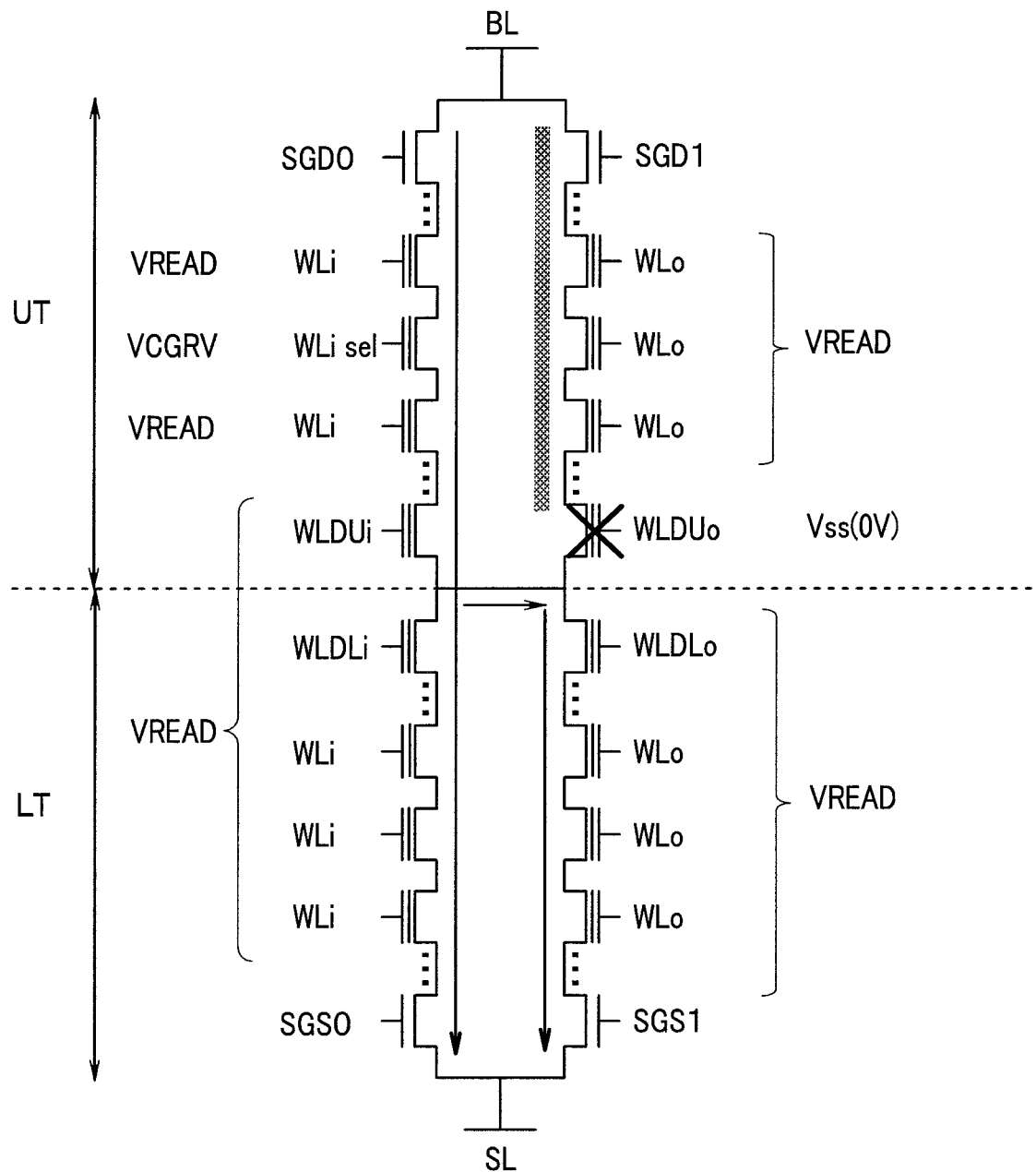
FIG. 20 is a diagram for describing a data reading operation in the third embodiment.
Figure 21:
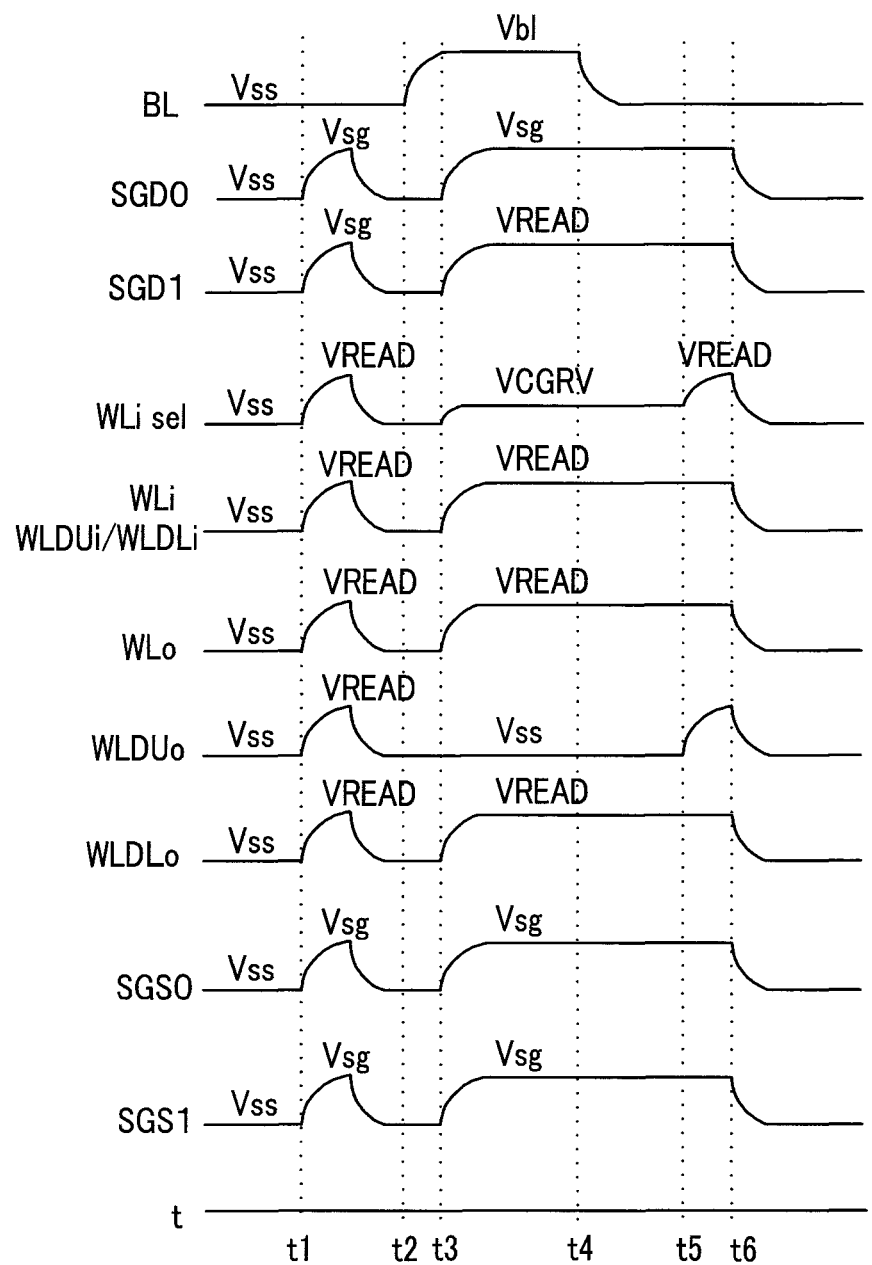
FIG. 21 is a diagram for describing a data reading operation in the third embodiment.

FIGS. 18, 19, 20, and 21 are diagrams for each describing a data reading method in the third embodiment. FIGS. 18 and 19 are explanatory diagrams of a case where a select cell MTsel is positioned in a lower layer portion LT in a front-side memory string formation section 44i. FIG. 18 illustrates a voltage to be applied to each of transistors at the time of reading. FIG. 19 illustrates a voltage application timing at the time of reading in each of wiring layers. FIGS. 20 and 21 are explanatory diagrams of a case where the select cell MTsel is positioned in an upper layer portion UT in the front-side memory string formation section 44i. FIG. 20 illustrates a voltage to be applied to each of transistors at the time of reading. FIG. 21 illustrates a voltage application timing at the time of reading in each of wiring layers.

Although in the memory string formation section 44 facing the memory string formation section 44 where the select cell MTsel is positioned, the transistor ST1/DT provided in an uppermost portion of the same layer as the layer where the select cell MTsel is positioned is turned off in the second embodiment, the present embodiment differs from the second embodiment in that a transistor DT/ST2 provided in a lowermost portion of the same layer as a layer where the select cell MTsel is positioned is turned off.

First, a case where the select cell MTsel is positioned in the lower layer portion LT in the front-side memory string formation section 44i will be described. As illustrated in FIG. 18, on the side of a rear-side memory string formation section 44o, a voltage (VREAD), which is always on, is applied to a word line WLo connected to a memory cell transistor MT and a word line WLDLo connected to a dummy cell transistor DT positioned in the lower layer portion LT. However, a ground voltage Vss is applied to a select gate transistor ST2 positioned in a lowermost portion of the lower layer portion LT to turn off the select gate transistor ST2.

In other words, as illustrated in FIG. 19, a voltage VCGRV as a reading reference is applied to a word line WLisel connected to the select cell MTsel at a time t3 as a reading start timing. A voltage VREAD, which is always on regardless of a threshold value of the memory cell transistor MT, is applied to word lines WLi and WLo connected to the other memory cell transistors MT and word lines WLDLi, WLDUi, WLDLo, and WLDUo connected to the dummy cell transistor DT. On the other hand, a voltage Vss is applied to a select gate line SGS1, to turn off the select gate transistor ST1. A voltage Vsg is applied to select gate lines SGD0, SGD1, and SGS0, to turn on the corresponding select gate transistors ST1 or ST2. In such a bias state, a current Icell flowing through the memory string structure 14 is detected by a sense amplifier SA so that data stored in the select cell MTsel can be judged.

When a voltage is thus applied to each of the cells in the rear-side memory string formation section 44o, a channel is formed in a channel formation film 16o in the rear-side memory string formation section 44o, and a potential of the channel is fixed to a bit line potential. A current path to the lower layer portion LT in the rear-side string formation section 44o from a channel in the upper layer portion UT in the front-side memory string formation section 44i via a joint portion JL is disconnected. Thus, a cell current Icell, which is always large, is detected by the sense amplifier SA only when the select cell MTsel is on, and a current is hardly detected when the select cell MTsel is off. Therefore, erroneous reading can be further prevented, and operation reliability can be improved.

Then, a case where the select cell MTsel is positioned in the upper layer portion UT in the front-side memory string formation section 44i will be described. As illustrated in FIG. 20, on the side of the rear-side memory string formation section 44o, a voltage (VREAD), which is always on, is applied to a word line WLo connected to the memory cell transistor MT positioned in the upper layer portion UT. A voltage, which is turned on, is also applied to the select gate transistor ST1. On the other hand, a ground voltage Vss is applied to a word line WLDLo connected to the dummy cell transistor DT, to turn off the dummy cell transistor DT.

In other words, as illustrated in FIG. 21, a voltage VCGRV as a reading reference is applied to a word line WLisel connected to the select cell MTsel at a time t3 as a reading start timing. A voltage VREAD, which is always on regardless of a threshold value of the memory cell transistor MT, is applied to word lines WLi and WLo connected to the other memory cell transistors MT and word lines WLDLi, WLDUi, and WLDLo connected to the dummy cell transistor DT. On the other hand, a voltage Vss is applied to a word line WLDUo connected to the dummy cell transistor DT, to turn off the dummy cell transistor DT. A voltage Vsg is applied to select gate lines SGD0, SGD1, SGS0, and SGS1, to turn on the corresponding select gate transistors ST1 or ST2. In such a bias state, a current Icell flowing through the memory string structure 14 is detected by the sense amplifier SA so that data stored in the select cell MTsel can be judged.

When a voltage is thus applied to each of the cells in the rear-side memory string formation section 44o, a channel is formed in a channel formation film 16o in the rear-side memory string formation section 44o, and a potential of the channel is fixed to a source line potential. A current path to the lower layer portion LT in the front-side memory string formation section 44i from a channel in the upper layer portion UT in the rear-side memory string formation section 44i via the joint portion JL is disconnected. Thus, a cell current Icell, which is always large, is detected by the sense amplifier SA only when the select cell MTsel is on, and a current is hardly detected when the select cell MTsel is off. Therefore, erroneous reading can be further prevented, and operation reliability can be improved.

Fourth Embodiment

Then, a semiconductor storage apparatus according to a fourth embodiment of the present invention will be described. The semiconductor storage apparatus according to the present embodiment differs from the semiconductor storage apparatuses according to the above-described embodiments in a voltage to be applied to each of transistors at the time of a data reading operation. A configuration of the semiconductor storage apparatus according to the present embodiment is similar to the configuration of the above-described semiconductor storage apparatus according to the first embodiment, and hence description thereof is omitted.

In a data reading method in the semiconductor storage apparatus according to the present embodiment, when a select cell MTsel is positioned in a lower layer portion LT in a front-side memory string formation section 44i, a dummy cell transistor DT positioned in an uppermost layer of a lower layer portion LT (just below a joint portion JL) in a rear-side memory string formation section 44o is turned off, like in the second embodiment described with reference to FIGS. 14 and 15. On the other hand, if a select cell MTsel is positioned in an upper layer portion UT in the front-side memory string formation section 44i, a dummy cell transistor DT positioned in a lowermost layer of the lower layer portion LT (just above the joint portion JL) in the rear-side memory string formation section 44o is turned off, like in the third embodiment described with reference to FIGS. 20 and 21.

In the present embodiment, although a fixed potential of a channel formed in a channel formation film 16o in the rear-side memory string formation section 44o may differ depending on an address of a word line WL, cutoff of a current path is performed not using select gate transistors ST1 and ST2 but only a dummy cell transistor DT so that controllability is improved. An optimum example can also be incorporated into a sequencer 17 in a nonvolatile memory 2 depending on a cell characteristic to be obtained or a priority of voltage controllability, or an optimum example can also be selectively implemented depending on a parameter, a command, or the like.

Fifth Embodiment

Then, a semiconductor storage apparatus according to a fifth embodiment of the present invention will be described. The semiconductor storage apparatus according to the present embodiment differs from the semiconductor storage apparatuses according to the above-described embodiments in a voltage to be applied to each of transistors at the time of a data reading operation. A configuration of the semiconductor storage apparatus according to the present embodiment is similar to the configuration of the above-described semiconductor storage apparatus according to the first embodiment, and hence description thereof is omitted.

In a data reading method in the semiconductor storage apparatus according to the present embodiment, when a select cell MTsel is positioned in a lower layer portion LT in a front-side memory string formation section 44i, a select gate transistor ST2 positioned in a lowermost layer of a lower layer portion LT in a rear-side memory string formation section 44o is turned off, like in the third embodiment described with reference to FIGS. 18 and 19. On the other hand, if a select cell MTsel is positioned in an upper layer portion UT in the front-side memory string formation section 44i, a select gate transistor ST1 positioned in an uppermost layer of the lower layer portion LT in the rear-side memory string formation section 44o is turned off, like in the second embodiment described with reference to FIGS. 16 and 17.

In the present embodiment, a channel potential formed in a channel formation film 16o in the rear-side memory string formation section 44o is fixed to a source line potential or is fixed to a bit line potential depending on a position of the select cell MTsel. Thus, a difference may occur in a reading characteristic. However, control of word lines WLDUo and WLDLo connected to a dummy cell transistor DT does not depend on an address but may be similar to control on the side of the front-side memory string formation section 44i so that controllability is improved. An optimum example can also be incorporated into a sequencer 17 in a nonvolatile memory 2 depending on a cell characteristic to be obtained or a priority of voltage controllability, or an optimum example can also be selectively implemented depending on a parameter, a command, or the like.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the gist of the inventions. The accompanying claims and their equivalents are intended to cover such forms or modifications as would fall within the scope and spirit of the inventions.

What is claimed is:

1. A semiconductor storage apparatus comprising:
a semiconductor substrate including a substrate surface extending in a first direction and a second direction intersecting the first direction;
a source line arranged on the substrate surface;
a plurality of first word lines arranged over the source line and stacked in a third direction perpendicular to the first direction and the second direction, each of the first word line including a first base portion extending in the first direction and a plurality of first extension portions extending from the first base portion in the second direction at intervals in the first direction;
a plurality of second word lines arranged over the source line and stacked in the third direction, each of the second word line including a second base portion extending in the first direction and a plurality of second extension portions extending from the second base portion in the second direction at the intervals in the first direction, each of the second word lines and a corresponding one of the first word lines having the same position in the third direction such that distal ends of the second extension portions face the first base portion and such that distal ends of the first extension portions face the second base portion;
a plurality of bit lines arranged over the first word lines and the second word lines and extending in the first direction; and
a memory cell array including a plurality of memory string structures extending in the third direction and respectively connected between corresponding of the bit lines and the source line, wherein
each of the memory string structures comprises:
a first memory string formation section arranged on one side in the first direction, formed by a channel formation film and a charge storage film, and including a select gate transistor and a plurality of memory cell transistors connected in series, the memory cell transistors of the first memory string formation section facing the first word lines, respectively,
a second memory string formation section arranged on another side in the first direction, formed by a channel formation film and a charge storage film, and including a select gate transistor and a plurality of memory cell transistors connected in series, and
a conductive section configured to electrically connect at least one portion of the first memory string formation section with at least one portion of the second memory string formation section; and
during a reading operation to a first memory cell transistor included in the first memory string formation section,
at least one of the plurality of memory cell transistors and the select gate transistor in the second memory string formation section is turned off while the remaining ones of the plurality of memory cell transistors and the select gate transistor are turned on such that a channel of a second memory cell transistor in the second memory string formation section having the same position in the third direction as the first memory cell transistor is fixed to a potential of the source line or a potential of the bit line; and
at least a second memory cell transistor included in the second memory string formation section having the same position in the third direction as the first memory cell transistor is turned on, while at least one of the remaining memory cell transistors and the select gate transistor, in the second memory string formation section is turned off such that a channel of the second memory cell transistor is fixed to the potential of the source line or the potential of the bit line, wherein
each of the first and second memory string formation sections comprises as the select gate transistor;
a drain-side select gate transistor arranged between the plurality of memory cell transistors and the bit lines, and
a source-side select gate transistor arranged between the plurality of memory cell transistors and the source line,
among the plurality of memory cell transistors, a memory cell transistor adjacent to the conductive section and positioned above the conductive section functions as an upper-side dummy memory cell transistor, and
among the plurality of memory cell transistors, a memory cell transistor adjacent to the conductive section and positioned below the conductive section functions as a lower-side dummy memory cell transistor;
when the first memory cell transistor as a target of the reading operation is positioned below the conductive section in the first memory string formation section, the second memory string formation section;
supplies an on voltage to a gate of the drain-side select gate transistor,
supplies an on voltage to a gate of the upper-side dummy memory cell transistor,
supplies an off voltage to a gate of the lower-side dummy memory cell transistor, and
supplies an on voltage to a gate of the source-side select gate transistor; and
when the first memory cell transistor as a target of the reading operation is positioned above the conductive section in the first memory string formation section, the second memory string formation section;

supplies an off voltage to a gate of the drain-side select gate transistor,
supplies an on voltage to a gate of the upper-side dummy memory cell transistor,
supplies an on voltage to a gate of the lower-side dummy memory cell transistor, and
supplies an on voltage to a gate of the source-side select gate transistor.

2. A semiconductor storage apparatus comprising:
a semiconductor substrate including a substrate surface extending in a first direction and a second direction intersecting the first direction;
a source line arranged on the substrate surface;
a plurality of first word lines arranged over the source line and stacked in a third direction perpendicular to the first direction and the second direction, each of the first word line including a first base portion extending in the first direction and a plurality of first extension portions extending from the first base portion in the second direction at intervals in the first direction;
a plurality of second word lines arranged over the source line and stacked in the third direction, each of the second word line including a second base portion extending in the first direction and a plurality of second extension portions extending from the second base portion in the second direction at the intervals in the first direction, each of the second word lines and a corresponding one of the first word lines having the same position in the third direction such that distal ends of the second extension portions face the first base portion and such that distal ends of the first extension portions face the second base portion;
a plurality of bit lines arranged over the first word lines and the second word lines and extending in the first direction; and
a memory cell array including a plurality of memory string structures extending in the third direction and respectively connected between corresponding of the bit lines and the source line, wherein
each of the memory string structures comprises:
 a first memory string formation section arranged on one side in the first direction, formed by a channel formation film and a charge storage film, and including a select gate transistor and a plurality of memory cell transistors connected in series, the memory cell transistors of the first memory string formation section facing the first word lines, respectively,
 a second memory string formation section arranged on another side in the first direction, formed by a channel formation film and a charge storage film, and including a select gate transistor and a plurality of memory cell transistors connected in series, and
 a conductive section configured to electrically connect at least one portion of the first memory string formation section with at least one portion of the second memory string formation section; and
during a reading operation to a first memory cell transistor included in the first memory string formation section,
 at least one of the plurality of memory cell transistors and the select gate transistor in the second memory string formation section is turned off while the remaining ones of the plurality of memory cell transistors and the select gate transistor are turned on such that a channel of a second memory cell transistor in the second memory string formation section having the same position in the third direction as the first memory cell transistor is fixed to a potential of the source line or a potential of the bit line; and
 at least a second memory cell transistor included in the second memory string formation section having the same position in the third direction as the first memory cell transistor is turned on, while at least one of the remaining memory cell transistors and the select gate transistor, in the second memory string formation section is turned off such that a channel of the second memory cell transistor is fixed to the potential of the source line or the potential of the bit line, wherein
each of the first and second memory string formation sections comprises as the select gate transistor;
a drain-side select gate transistor arranged between the plurality of memory cell transistors and the bit lines, and
a source-side select gate transistor arranged between the plurality of memory cell transistors and the source line,
among the plurality of memory cell transistors, a memory cell transistor adjacent to the conductive section and positioned above the conductive section functions as an upper-side dummy memory cell transistor, and
among the plurality of memory cell transistors, a memory cell transistor adjacent to the conductive section and positioned below the conductive section functions as a lower-side dummy memory cell transistor;
when the first memory cell transistor as a target of the reading operation is positioned below the conductive section in the first memory string formation section, the second memory string formation section;
supplies an on voltage to a gate of the drain-side select gate transistor,
supplies an on voltage to a gate of the upper-side dummy memory cell transistor,
supplies an on voltage to a gate of the lower-side dummy memory cell transistor, and
supplies an off voltage to a gate of the source-side select gate transistor; and
when the first memory cell transistor as a target of the reading operation is positioned above the conductive section in the first memory string formation section, the second memory string formation section:
supplies an on voltage to a gate of the drain-side select gate transistor,
supplies an off voltage to a gate of the upper-side dummy memory cell transistor,
supplies an on voltage to a gate of the lower-side dummy memory cell transistor, and
supplies an on voltage to a gate of the source-side select gate transistor.

3. A semiconductor storage apparatus comprising:
a semiconductor substrate including a substrate surface extending in a first direction and a second direction intersecting the first direction;
a source line arranged on the substrate surface;
a plurality of first word lines arranged over the source line and stacked in a third direction perpendicular to the first direction and the second direction, each of the first word line including a first base portion extending in the first direction and a plurality of first extension portions extending from the first base portion in the second direction at intervals in the first direction;
a plurality of second word lines arranged over the source line and stacked in the third direction, each of the second word line including a second base portion extending in the first direction and a plurality of second extension portions extending from the second base portion in the second direction at the intervals in the first direction, each of the second word lines and a corresponding one of the first word lines having the same position in the third direction such that distal ends of the second extension portions face the first base portion and such that distal ends of the first extension portions face the second base portion;

a plurality of bit lines arranged over the first word lines and the second word lines and extending in the first direction; and a memory cell array including a plurality of memory string structures extending in the third direction and respectively connected between corresponding of the bit lines and the source line, wherein each of the memory string structures comprises:
    a first memory string formation section arranged on one side in the first direction, formed by a channel formation film and a charge storage film, and including a select gate transistor and a plurality of memory cell transistors connected in series, the memory cell transistors of the first memory string formation section facing the first word lines, respectively,
    a second memory string formation section arranged on another side in the first direction, formed by a channel formation film and a charge storage film, and including a select gate transistor and a plurality of memory cell transistors connected in series, and
    a conductive section configured to electrically connect at least one portion of the first memory string formation section with at least one portion of the second memory string formation section; and during a reading operation to a first memory cell transistor included in the first memory string formation section,
    at least one of the plurality of memory cell transistors and the select gate transistor in the second memory string formation section is turned off while the remaining ones of the plurality of memory cell transistors and the select gate transistor are turned on such that a channel of a second memory cell transistor in the second memory string formation section having the same position in the third direction as the first memory cell transistor is fixed to a potential of the source line or a potential of the bit line; and at least a second memory cell transistor included in the second memory string formation section having the same position in the third direction as the first memory cell transistor is turned on, while at least one of the remaining memory cell transistors and the select gate transistor, in the second memory string formation section is turned off such that a channel of the second memory cell transistor is fixed to the potential of the source line or the potential of the bit line, wherein each of the first and second memory string formation sections comprises as the select gate transistor;

a drain-side select gate transistor arranged between the plurality of memory cell transistors and the bit lines, and a source-side select gate transistor arranged between the plurality of memory cell transistors and the source line, among the plurality of memory cell transistors, a memory cell transistor adjacent to the conductive section and positioned above the conductive section functions as an upper-side dummy memory cell transistor, and among the plurality of memory cell transistors, a memory cell transistor adjacent to the conductive section and positioned below the conductive section functions as a lower-side dummy memory cell transistor;

when the first memory cell transistor as a target of the reading operation is positioned below the conductive section in the first memory string formation section, the second memory string formation section;

supplies an on voltage to a gate of the drain-side select gate transistor, supplies an on voltage to a gate of the upper-side dummy memory cell transistor, supplies an off voltage to a gate of the lower-side dummy memory cell transistor, and supplies an on voltage to a gate of the source-side select gate transistor; and when the first memory cell transistor as a target of the reading operation is positioned above the conductive section in the first memory string formation section, the second memory string formation section;

supplies an on voltage to a gate of the drain-side select gate transistor, supplies an off voltage to a gate of the upper-side dummy memory cell transistor, supplies an on voltage to a gate of the lower-side dummy memory cell transistor, and supplies an on voltage to a gate of the source-side select gate transistor.

4. A semiconductor storage apparatus comprising:

a semiconductor substrate including a substrate surface extending in a first direction and a second direction intersecting the first direction;

a source line arranged on the substrate surface;

a plurality of first word lines arranged over the source line and stacked in a third direction perpendicular to the first direction and the second direction, each of the first word line including a first base portion extending in the first direction and a plurality of first extension portions extending from the first base portion in the second direction at intervals in the first direction;

a plurality of second word lines arranged over the source line and stacked in the third direction, each of the second word line including a second base portion extending in the first direction and a plurality of second extension portions extending from the second base portion in the second direction at the intervals in the first direction, each of the second word lines and a corresponding one of the first word lines having the same position in the third direction such that distal ends of the second extension portions face the first base portion and such that distal ends of the first extension portions face the second base portion;

a plurality of bit lines arranged over the first word lines and the second word lines and extending in the first direction; and a memory cell array including a plurality of memory string structures extending in the third direction and respectively connected between corresponding of the bit lines and the source line, wherein each of the memory striae structures comprises:
    a first memory string formation section arranged on one side in the first direction, formed by a channel formation film and a charge storage film, and including a select gate transistor and a plurality of memory cell transistors connected in series, the memory cell transistors of the first memory string formation section facing the first word lines, respectively,
    a second memory string formation section arranged on another side in the first direction, formed by a channel formation film and a charge storage film, and including a select gate transistor and a plurality of memory cell transistors connected in series, and a conductive section configured to electrically connect at least one portion of the first memory string formation section with at least one portion of the second memory string formation section; and during a reading operation to a first memory cell transistor included in the first memory string formation section, at least one of the plurality of memory cell transistors and the select gate transistor in the second memory string formation section is turned off while the remaining ones of the plurality of memory cell transistors and the select gate transistor are turned on such that a channel of a second memory cell transistor in the second memory string formation section having the same position in the third direction as the first memory cell transistor is fixed to a potential of the source line or a potential of the bit line; and at least a second memory cell transistor included in the second memory string formation section having the same position in the third direction as the first memory cell transistor is turned on, while at least one of the remaining memory cell transistors and the select gate transistor, in the second memory string formation section is turned off such that a channel of the second memory cell transistor is fixed to the potential of the source line or the potential of the bit line, wherein each of the first and second memory string formation sections comprises as the select gate transistor;

a drain-side select gate transistor arranged between the plurality of memory cell transistors and the bit lines, and a source-side select gate transistor arranged between the plurality of memory cell transistors and the source line, among the plurality of memory cell transistors, a memory cell transistor adjacent to the conductive section and positioned above the conductive section functions as an upper-side dummy memory cell transistor, and among the plurality of memory cell transistors, a memory cell transistor adjacent to the conductive section and positioned below the conductive section functions as a lower-side dummy memory cell transistor;

when the first memory cell transistor as a target of the reading operation is positioned below the conductive section in the first memory string formation section, the second memory string formation section;

supplies an on voltage to a gate of the drain-side select gate transistor, supplies an on voltage to a gate of the upper-side dummy memory cell transistor, supplies an on voltage to a gate of the lower-side dummy memory cell transistor, and supplies an off voltage to a gate of the source-side select gate transistor; and when the first memory cell transistor as a target of the reading operation is positioned above the conductive section in the first memory string formation section, the second memory string formation section;

supplies an off voltage to a gate of the drain-side select gate transistor, supplies an on voltage to a gate of the upper-side dummy memory cell transistor, supplies an on voltage to a gate of the lower-side dummy memory cell transistor, and supplies an on voltage to a gate of the source-side select gate transistor.

* * * * *